(12) United States Patent
Asaoka et al.

(10) Patent No.: US 12,349,532 B2
(45) Date of Patent: Jul. 1, 2025

(54) LIGHT-EMITTING ELEMENT, LIGHT-EMITTING DEVICE, AND METHOD FOR MANUFACTURING LIGHT-EMITTING ELEMENT

(71) Applicant: SHARP KABUSHIKI KAISHA, Sakai (JP)

(72) Inventors: Yasushi Asaoka, Sakai (JP); Kanako Nakata, Sakai (JP); Tatsuya Ryohwa, Sakai (JP); Makoto Izumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 743 days.

(21) Appl. No.: 17/770,579

(22) PCT Filed: Oct. 31, 2019

(86) PCT No.: PCT/JP2019/042854
§ 371 (c)(1),
(2) Date: Apr. 20, 2022

(87) PCT Pub. No.: WO2021/084701
PCT Pub. Date: May 6, 2021

(65) Prior Publication Data
US 2023/0027405 A1  Jan. 26, 2023

(51) Int. Cl.
*H10K 50/135* (2023.01)
*H10H 20/01* (2025.01)
*H10H 20/831* (2025.01)
*H10H 20/851* (2025.01)
(Continued)

(52) U.S. Cl.
CPC .......... *H10K 50/135* (2023.02); *H10H 20/01* (2025.01); *H10H 20/831* (2025.01); *H10H 20/8514* (2025.01); *H10H 29/142* (2025.01); *H10K 59/80515* (2023.02); *H10K 59/80521* (2023.02);
(Continued)

(58) Field of Classification Search
None
See application file for complete search history.

(56) References Cited

U.S. PATENT DOCUMENTS

2008/0224089 A1  9/2008  Pei
2017/0294616 A1  10/2017  Yonekawa
2018/0366646 A1  12/2018  Yonekawa et al.
(Continued)

FOREIGN PATENT DOCUMENTS

JP  2016-058172 A  4/2016
JP  2016-062745 A  4/2016
(Continued)

*Primary Examiner* — Zandra V Smith
*Assistant Examiner* — Molly K Reida
(74) *Attorney, Agent, or Firm* — ScienBiziP, P.C.

(57) ABSTRACT

A light-emitting element contains negative ions and positive ions, and includes a solid ionic layer, a layer containing quantum dots, and a cathode electrode and an anode electrode. The ionic layer includes a p-type doped region on the anode electrode side containing the negative ions in a higher quantity than the positive ions, an n-type doped region on the cathode electrode side containing the positive ions in a higher quantity than the negative ions, and a junction region between the p-type doped region and the n-type doped region. The layer containing the quantum dots is adjacent to the junction region. Alternatively, the quantum dots are contained in the junction region. Alternatively, the quantum dots are adjacent to the junction region.

16 Claims, 21 Drawing Sheets

(51) Int. Cl.
    *H10H 29/14*     (2025.01)
    *H10K 59/80*     (2023.01)

(52) U.S. Cl.
    CPC ......... *H10K 59/878* (2023.02); *H10H 20/032* (2025.01)

(56) References Cited

U.S. PATENT DOCUMENTS

2021/0020699 A1    1/2021    Yoshimura et al.
2021/0036254 A1    2/2021    Ryohwa et al.

FOREIGN PATENT DOCUMENTS

| | | |
|---|---|---|
| JP | 2016-096328 A | 5/2016 |
| WO | 2017/018328 A1 | 2/2017 |
| WO | 2019/180877 A1 | 9/2019 |
| WO | 2019/186844 A1 | 10/2019 |

LIGHT-EMITTING ELEMENT, LIGHT-EMITTING DEVICE, AND METHOD FOR MANUFACTURING LIGHT-EMITTING ELEMENT

TECHNICAL FIELD

The disclosure relates to electrochemical light-emitting elements and light-emitting devices including the electrochemical light-emitting elements.

BACKGROUND ART

Patent Literature (PTL) 1 discloses an electrochemical light-emitting element in which a voltage is applied to an ionic layer containing electrolytes and quantum dots to form a p-n junction in the ionic layer, thereby causing the quantum dots to emit light.

CITATION LIST

Patent Literature

PTL 1: JP 2016-58172 A

SUMMARY OF INVENTION

Technical Problem

In order to cause the electrochemical light-emitting element described in PTL 1 to emit light, it is needed that a potential difference is generated across a pair of electrodes sandwiching the ionic layer to form an electric double layer between the ionic layer and each electrode, and that an n-type doped region and a p-type doped region are formed in the ionic layer. Due to this, a time for the electrolytes in the ionic layer to move is required in order to shift from a non-light emission state to a light emission state. Accordingly, the above-described electrochemical light-emitting element has a problem that the response speed is slow.

Solution to Problem

In order to solve the problem described above, a light-emitting element according to an aspect of the disclosure includes an ionic layer being a solid and containing negative ions and positive ions; a light-emitting layer containing quantum dots; and a cathode electrode and an anode electrode. The ionic layer includes a p-type doped region on the anode electrode side containing the negative ions in a higher quantity than the positive ions, an n-type doped region on the cathode electrode side containing the positive ions in a higher quantity than the negative ions, and a junction region between the p-type doped region and the n-type doped region. The light-emitting layer is adjacent to the junction region.

In order to solve the problem described above, a light-emitting element according to another aspect of the disclosure includes a cathode electrode and an anode electrode; and an ionic layer being a solid and positioned between the cathode electrode and the anode electrode, and containing negative ions, positive ions, and quantum dots. The ionic layer includes a p-type doped region on the anode electrode side containing the negative ions in a higher quantity than the positive ions, an n-type doped region on the cathode electrode side containing the positive ions in a higher quantity than the negative ions, and a junction region between the p-type doped region and the n-type doped region. The ionic layer contains the quantum dots in the junction region or contains the quantum dots adjacent to the junction region.

In order to solve the above-described problem, a method for manufacturing a light-emitting element according to an aspect of the disclosure includes forming a cathode electrode and an anode electrode; forming a light-emitting layer containing quantum dots; subsequent to the forming a light-emitting layer, applying an ionic liquid containing negative ions, positive ions, and a curable resin to a position in contact with the light-emitting layer; applying a voltage to the ionic liquid by driving the cathode electrode and the anode electrode, after the applying an ionic liquid, the forming a light-emitting layer, and the forming a cathode electrode and an anode electrode; and forming a solid ionic layer by curing the ionic liquid while the applying a voltage to the ionic liquid is being carried out.

In order to solve the above-described problem, a method for manufacturing a light-emitting element according to an aspect of the disclosure includes forming a cathode electrode and an anode electrode; applying an ionic liquid containing negative ions, positive ions, quantum dots, and a curable resin; applying a voltage to the ionic liquid by driving the cathode electrode and the anode electrode, after the applying an ionic liquid and the forming a cathode electrode and an anode electrode; and forming a solid ionic layer by curing the ionic liquid while the applying a voltage to the ionic liquid is being carried out.

Advantageous Effects of Disclosure

According to an aspect of the disclosure, an electrochemical light-emitting element with an improved response speed may be provided.

DESCRIPTION OF EMBODIMENTS

First Embodiment

Figure 1:
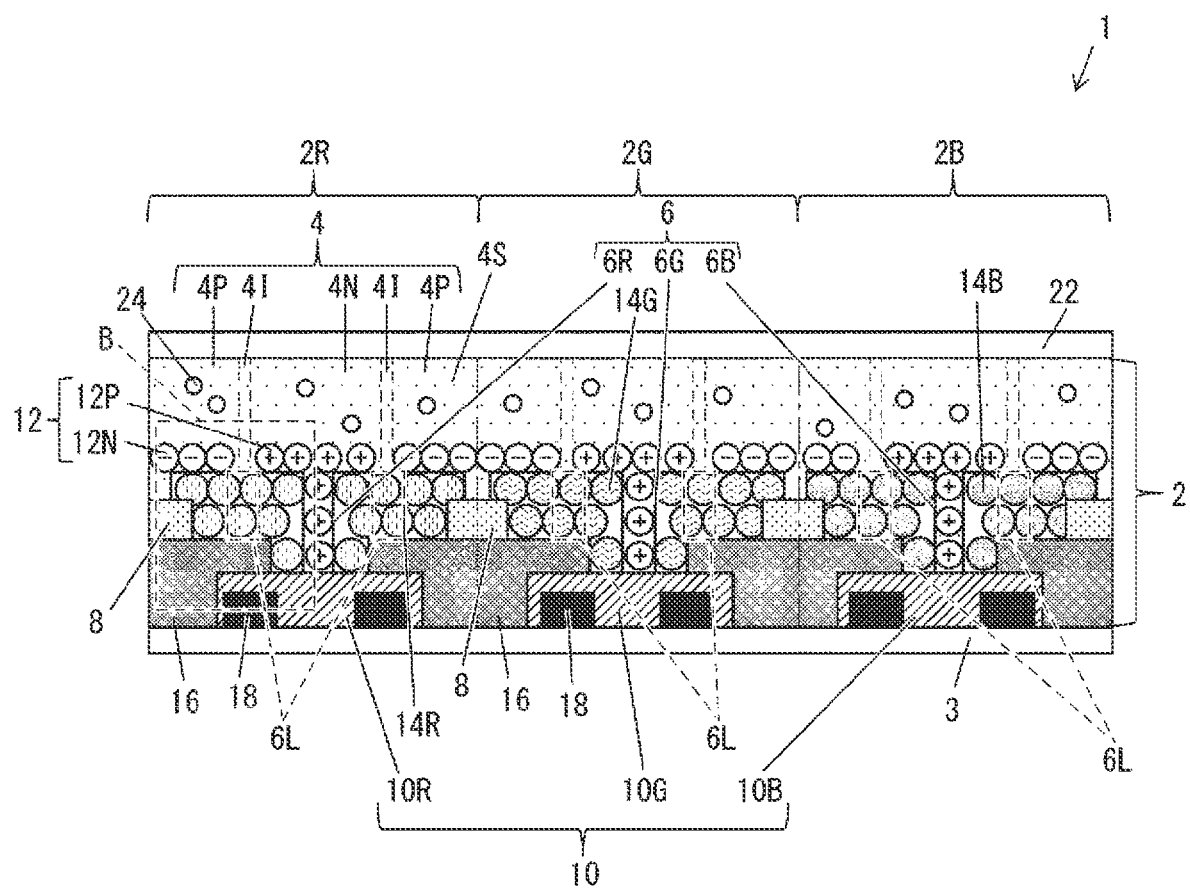
FIG. 1 is a schematic cross-sectional view of a display device according to a first embodiment.
Figure 2:
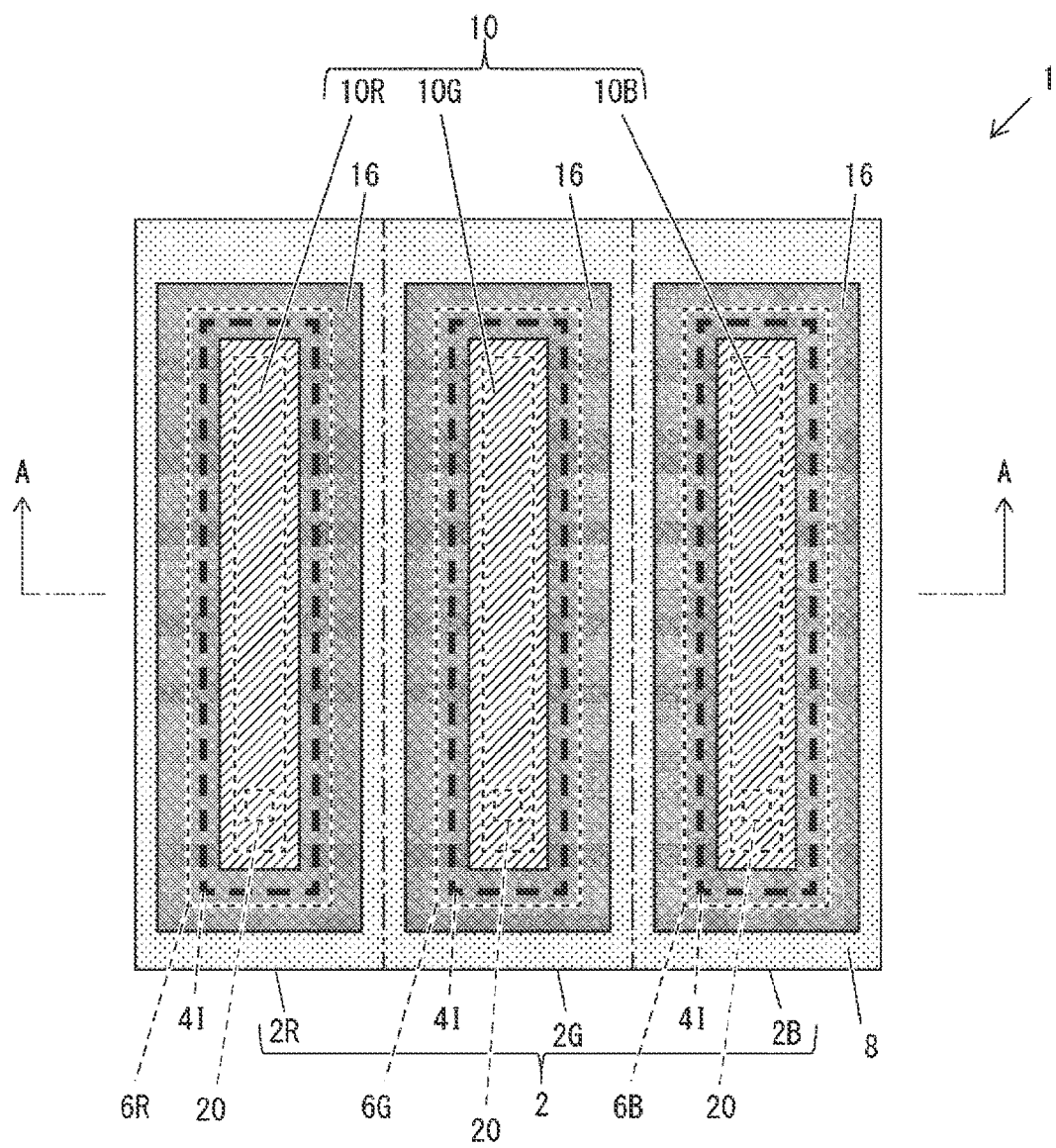
FIG. 2 is a schematic plan view of the display device according to the first embodiment.

FIG. 2 is a schematic plan view of a display device 1 according to the present embodiment. FIG. 1 is a schematic cross-sectional view of the display device 1 according to the present embodiment, and is a cross-sectional view taken along an arrow line A-A in FIG. 2. In the present specification, in the schematic plan view of the display device 1, as for an ionic layer 4, which will be described in detail below, only an outer shape of a junction region 4I is extracted and illustrated in order to simplify the drawing. Further, in the present specification, in the schematic plan view of the display device 1, as for a light-emitting layer 6 and a contact portion 20 as well, which will be described in detail below, only outer shapes thereof are extracted and illustrated. Furthermore, in the schematic cross-sectional view of the display device 1 in the present specification, the direction from an array substrate 3 toward a light-emitting element 2, which will be described in detail below, is referred to as an upward direction.

As illustrated in FIG. 1, the display device 1 according to the present embodiment includes the light-emitting element 2 on the array substrate 3. As illustrated in FIG. 1 or FIG. 2, the light-emitting element 2 includes the ionic layer 4, the light-emitting layer 6, an anode electrode 8, and a cathode electrode 10. As illustrated in FIG. 1 or FIG. 2, the light-emitting element 2 includes a red light-emitting element 2R, a green light-emitting element 2G, and a blue light-emitting element 2B as a plurality of sub light-emitting elements.

In a plan view, the display device 1 forms each of subpixels of the display device 1 at a position overlapping each of the sub light-emitting elements. In other words, in a plan view, the display device 1 includes a red subpixel at a position overlapping the red light-emitting element 2R, includes a green subpixel at a position overlapping the green light-emitting element 2G, and includes a blue subpixel at a position overlapping the blue light-emitting element 2B.

The ionic layer 4 is a solid layer containing a plurality of ions 12 in a resin 4S. The plurality of ions 12 contain a plurality of negative ions 12N and a plurality of positive ions 12P. As illustrated in FIG. 1, in the present embodiment, the ionic layer 4 is formed continuously over the light-emitting layer 6, the anode electrode 8, and the cathode electrode 10. The ionic layer 4 is formed extending from the anode electrode 8 to the cathode electrode 10 in such a manner as to be adjacent to the light-emitting layer 6.

In the present specification, the expression "two members are adjacent to each other" indicates a state in which the two members are in contact with each other, a state in which the two members are in close proximity to each other, or a state in which the two members are adjacent to each other with a thin film interposed therebetween. For example, in the present embodiment, the ionic layer 4 is formed extending from the anode electrode 8 to the cathode electrode 10 in such a manner as to be in contact with the light-emitting layer 6.

The ionic layer 4 includes a p-type doped region 4P containing the negative ions 12N in a higher quantity than the positive ions 12P on the anode electrode 8 side, and includes an n-type doped region 4N containing the positive ions 12P in a higher quantity than the negative ions 12N on the cathode electrode 10 side. In addition, the ionic layer 4 includes the junction region 4I between the p-type doped region 4P and the n-type doped region 4N. Thus, the ionic layer 4 forms a pn junction or a pin junction, where the p-type doped region 4P and the n-type doped region 4N are joined to each other with the junction region 4I interposed therebetween.

In the present embodiment, the light-emitting layer 6 is formed for each sub light-emitting element, and is provided with semiconductor nanoparticles, that is, quantum dots. Specifically, the light-emitting layer 6 includes a red light-emitting layer 6R in the red light-emitting element 2R, a green light-emitting layer 6G in the green light-emitting element 2G, and a blue light-emitting layer 6B in the blue light-emitting element 2B. The red light-emitting layer 6R includes red quantum dots 14R configured to emit red light, the green light-emitting layer 6G includes green quantum dots 14G configured to emit green light, and the blue light-emitting layer 6B includes blue quantum dots 14B configured to emit blue light.

Here, the blue light is light having the light-emitting central wavelength in a wavelength band from 400 nm to 500 nm. The green light is light having the light-emitting central wavelength in a wavelength band longer than 500 nm and shorter than or equal to 600 nm. The red light is light having the light-emitting central wavelength in a wavelength band longer than 600 nm and shorter than or equal to 780 nm. The quantum dots included in the light-emitting layer 6 may have a known structure, for example, may have a core/shell structure, and a plurality of ligands may be coordinated in the shell.

In the present embodiment, the anode electrode 8 is a common electrode common to the plurality of sub light-emitting elements, namely, the red light-emitting element 2R, green light-emitting element 2G, and blue light-emitting element 2B. The cathode electrode 10 is an island-shaped electrode formed in an island shape for each of the sub light-emitting elements.

In particular, in the present embodiment, as illustrated in FIG. 1 and FIG. 2, the cathode electrode 10 includes a cathode electrode 10R formed in the red light-emitting element 2R, a cathode electrode 10G formed in the green light-emitting element 2G, and a cathode electrode 10B formed in the blue light-emitting element 2B. As illustrated in FIG. 2, the anode electrode 8 has an opening at a position overlapping with each cathode electrode 10 in a plan view. In other words, the anode electrode 8 is formed at a position surrounding each cathode electrode 10 in a plan view.

As illustrated in FIG. 1, the anode electrode 8 and the cathode electrode 10 are electrically insulated by an insulating layer 16.

In the present embodiment, the ionic layer 4 is adjacent to each of the anode electrode 8 and the cathode electrode 10. For example, in the present embodiment, the ionic layer 4 may be in direct contact with both the anode electrode 8 and the cathode electrode 10. However, without being limited thereto, the ionic layer 4 and the anode electrode 8 may be adjacent to each other with a thin film such as a hole transport layer interposed therebetween; in a similar manner, the ionic layer 4 and the cathode electrode 10 may be adjacent to each other with a thin film such as an electron transport layer interposed therebetween.

Figure 3:
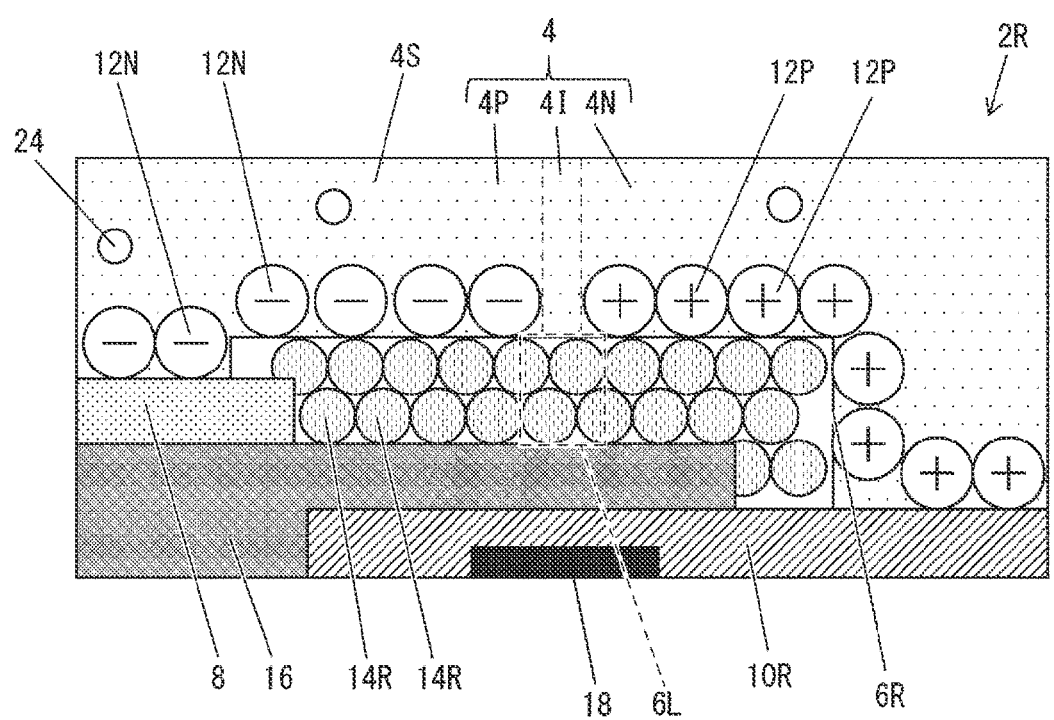
FIG. 3 is an enlarged cross-sectional view of a red light-emitting element of the display device according to the first embodiment.

With reference to FIG. 3 together with FIG. 1 and FIG. 2, the arrangement of the ionic layer 4 and the light-emitting layer 6 will be described in more detail. FIG. 3 is an enlarged cross-sectional view of the red light-emitting element 2R of the display device 1 according to the present embodiment, and is an enlarged cross-sectional view of a region B in FIG. 1.

As illustrated in FIG. 1 and FIG. 3, in the red light-emitting element 2R, the p-type doped region 4P of the ionic layer 4 includes the negative ions 12N adjacent to the anode electrode 8 and the anode electrode 8 side of the red light-emitting layer 6R. The n-type doped region 4N of the ionic layer 4 includes the positive ions 12P adjacent to the cathode electrode 10R and the cathode electrode 10R side of the red light-emitting layer 6R.

The junction region 4I of the ionic layer 4 is adjacent to the red light-emitting layer 6R. In particular, in the present embodiment, as illustrated in FIG. 1 to FIG. 3, the junction region 4I and the red light-emitting layer 6R are in contact with each other, and overlap with each other in a plan view.

In the present embodiment, the light-emitting layer 6 includes a light-emitting region 6L at a position overlapping with the junction region 4I in a plan view. In particular, the light-emitting region 6L is in contact with the junction region 4I. For example, in the red light-emitting element 2R, the light-emitting region 6L includes the red quantum dots 14R.

As illustrated in FIG. 1, the light-emitting region 6L is also formed, in the green light-emitting element 2G and the blue light-emitting element 2B, at the positions each overlapping with the junction region 4I. In particular, in the green light-emitting element 2G, the light-emitting region 6L includes the green quantum dots 14G, and in the blue light-emitting element 2B, the light-emitting region 6L includes the blue quantum dots 14B.

In the present embodiment, as illustrated in FIG. 1 and FIG. 3, in a plan view, the region where the n-type doped region 4N and the light-emitting layer 6 overlap each other, and the region where the p-type doped region 4P and the light-emitting layer 6 overlap each other are present across the region where the junction region 4I and the light-emitting layer 6 overlap each other.

The green light-emitting element 2G and the blue light-emitting element 2B have the same configuration as the red light-emitting element 2R except for the configuration of the light-emitting layer 6.

In a region adjacent to the p-type doped region 4P and the n-type doped region 4N, an electric double layer is formed by the ions 12 in the ionic layer 4. Thus, a strong electrical field is applied to the anode electrode 8 side of the red light-emitting layer 6R in contact with the n-type doped region 4N, the cathode electrode 10R side of the red light-emitting layer 6R in contact with the p-type doped region 4P, and the junction region 4I in the ionic layer 4. With this strong electrical field, electrons are injected to the vicinity of an interface where the red light-emitting layer 6R on the anode electrode 8 side in contact with the n-type doped region 4N makes contact with the ionic layer 4, and holes are injected to the vicinity of an interface where the red light-emitting layer 6R on the cathode electrode 10R side in contact with the p-type doped region 4P makes contact with the ionic layer 4.

When a voltage is applied between the anode electrode 8 and the cathode electrode 10R, the carriers respectively injected from the anode electrode 8 and the cathode electrode 10R are easily injected to the vicinity of the interfaces adjacent to the n-type doped region 4N of the red light-emitting layer 6R and the p-type doped region 4P thereof. The injection of the carriers from each of the electrodes to the red light-emitting layer 6R is easily achieved in comparison to the injection of the carriers from the electrodes to the light-emitting layer in a known layered type electroluminescent element because the electrical field formed by the electric double layer described above is sufficiently strong.

Positive holes injected into the red light-emitting layer 6R and positive holes injected into the p-type doped region 4P are respectively transported toward the light-emitting region 6L and the junction region 4I by the voltage applied between the anode electrode 8 and the cathode electrode 10R. Likewise, the electrons injected into the red light-emitting layer 6R and the electrons injected into the n-type doped region 4N are respectively transported toward the light-emitting region 6L and the junction region 4I by the voltage applied between the anode electrode 8 and the cathode electrode 10R. The transport of the carriers in the light-emitting layer 6 is achieved, for example, by hopping conduction via a shell or a ligand of the red quantum dot 14R.

The electrons and the positive holes injected into the red light-emitting layer 6R are transported to the light-emitting region 6L of the red light-emitting layer 6R. As a result, the positive holes injected into the red light-emitting layer 6R from the anode electrode 8 and the electrons injected into the red light-emitting layer 6R from the cathode electrode 10R are recombined in the red quantum dots 14R present in the light-emitting region 6L of the red light-emitting layer 6R.

Thus, by applying the voltage between the anode electrode 8 and the cathode electrode 10R, red light is emitted from the red quantum dots 14R. In other words, by applying the voltage between the anode electrode 8 and the cathode electrode 10R, red light is emitted from the light-emitting region 6L of the red light-emitting layer 6R. In this manner, the red light is emitted from the red light-emitting element 2R. In each of the green light-emitting element 2G and the blue light-emitting element 2B, green light and blue light are respectively emitted by the same principle.

In the present embodiment, the ionic layer 4 is a solid, and the positive ions 12P and the negative ions 12N in the ionic layer 4 are immobile, in other words, the p-type doped region 4P and the n-type doped region 4N are always formed in the ionic layer 4. Therefore, when each of the sub light-emitting elements is driven, each of the light-emitting layers 6 quickly emits light, and when the drive of each of the sub light-emitting elements is stopped, the light emission of each of the light-emitting layers 6 is quickly stopped.

In the present embodiment, the anode electrode 8 is preferably a transmitting electrode or a non-reflective electrode. This makes it possible to suppress external light reflection at the anode electrode 8. The cathode electrode 10 may be a transmitting electrode or a reflective electrode. When the cathode electrode 10 is a transmitting electrode, external light reflection at the cathode electrode 10 may be suppressed.

When each cathode electrode 10 is a transmitting electrode, each cathode electrode 10 includes a reflective layer 18 as illustrated in FIG. 1 and FIG. 3. The reflective layer 18 is formed at a position overlapping the light-emitting region 6L in a plan view. In other words, in the light-emitting element 2 according to the present embodiment, the junction region 4I, the light-emitting region 6L, and the reflective layer 18 are provided overlapping one another in that order in a plan view.

With this, because light from each light-emitting layer 6 is mainly emitted from the light-emitting region 6L of the light-emitting layer 6, the light from each of the light-emitting layers 6 is efficiently reflected by the reflective layer 18 or the cathode electrode 10, so that the light extraction efficiency at the upper side of the light-emitting element 2 is improved. Further, in a plan view, the reflective layer 18 is provided at the position overlapping with the light-emitting region 6L and is not provided on the entire surface of the cathode electrode 10, and thus the light extraction efficiency of the light-emitting element 2 may be improved while suppressing the external light reflection at the reflective layer 18.

The cathode electrode 10 may be electrically connected to each of subpixel circuits (not illustrated) provided in the array substrate 3, via the contact portion 20 illustrated in FIG. 2. A constant voltage may be applied to the anode electrode 8. With this, each of the sub light-emitting elements may be individually driven by driving the subpixel circuit of the array substrate 3.

As illustrated in FIG. 1, the light-emitting element 2 may be sealed by a sealing layer 22 formed on the light-emitting element 2. In order to improve the light extraction efficiency toward the upper side of the display device 1, the sealing layer 22 is preferably constituted by a transparent member.

The resin 4S in the ionic layer 4 may be a curable resin. In this case, as illustrated in FIG. 1 and FIG. 3, the ionic layer 4 may include a precursor 24 of the resin 4S. The precursor 24 may be, for example, a monomer having a polymerizable nature, and in this case, the resin 4S may be a polymer in which a plurality of precursors 24 are polymerized.

In the present embodiment, an example in which the light-emitting element 2 has an element structure such that the cathode electrode 10 is a pixel electrode electrically connected to each subpixel circuit, and the anode electrode 8 is a common electrode common to each of the subpixels, is cited and described, but the element structure is not limited thereto. In the present embodiment, the light-emitting element 2 may have an element structure such that the anode electrode 8 is a pixel electrode electrically connected to each subpixel circuit, and the cathode electrode 10 is a common electrode common to each of the subpixels.

Figure 4:
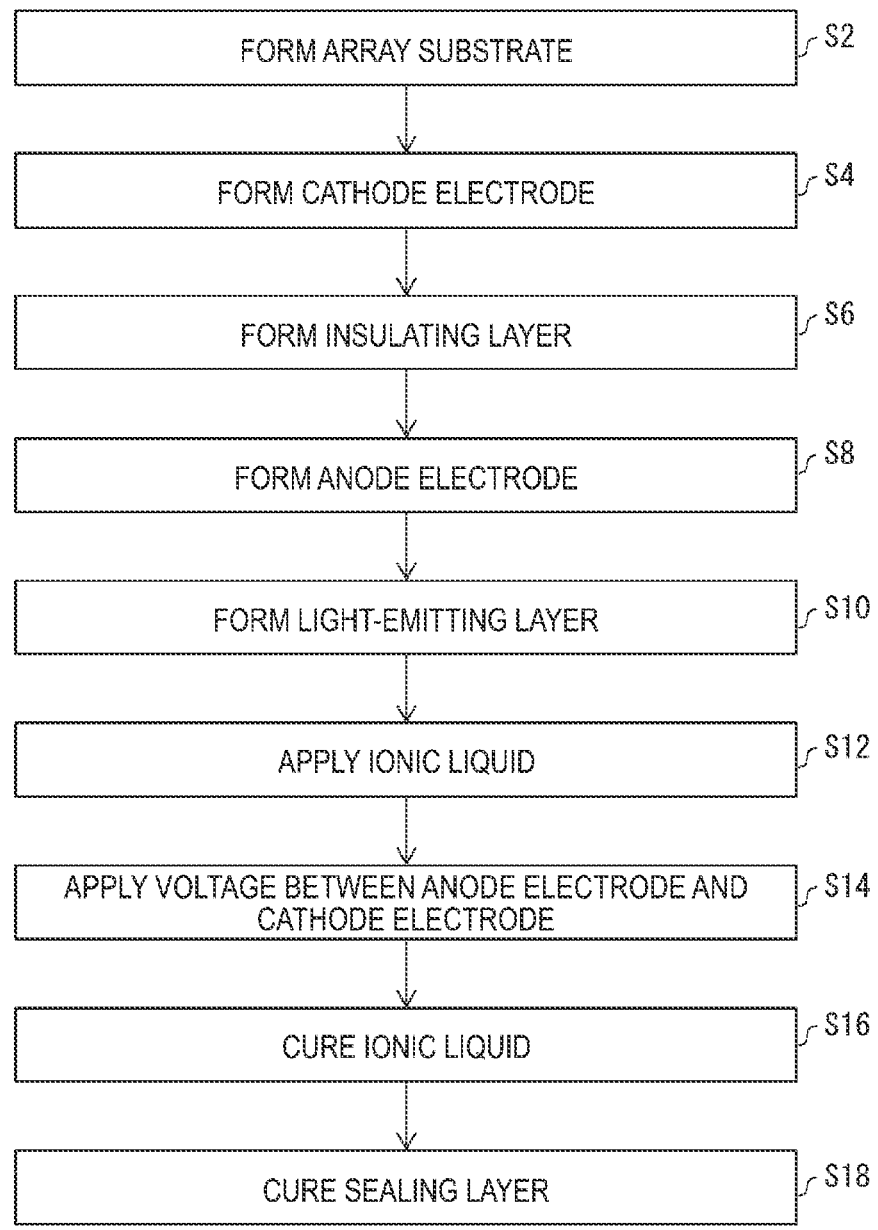
FIG. 4 is a flowchart for describing a manufacturing method for the display device according to the first embodiment.

A manufacturing method for the display device 1 according to the present embodiment will be described with reference to a flowchart illustrated in FIG. 4.

First, the array substrate 3 is formed (step S2). The formation of the array substrate 3 may be carried out by forming a plurality of subpixel circuits containing TFTs corresponding to the positions of the sub light-emitting elements with respect to the substrate.

Next, the cathode electrode 10 is formed (step S4). In step S4, for example, after a transparent electrode material having electrical conductivity, such as ITO, is film-formed by sputtering, the cathode electrode 10 may be formed for each sub light-emitting element by patterning the formed film corresponding to the position of the sub light-emitting element. Alternatively, the cathode electrode 10 may be formed for each sub light-emitting element by vapor-depositing a transparent electrode material by using a vapor deposition mask. In step S4, the reflective layer 18 may be formed by making part of the cathode electrode 10 be a reflective electrode containing a metal material such as Ag.

Next, the insulating layer 16 is formed (step S6). The insulating layer 16 may be obtained, after being applied on the array substrate 3 and the cathode electrode 10, by patterning. The patterning of the insulating layer 16 may be performed by photolithography.

Next, the anode electrode 8 is formed (step S8). In step S8, the anode electrode 8 may be formed by the same technique as that of the cathode electrode 10. With this, an electrode formation step of forming the anode electrode 8 and the cathode electrode 10 is completed.

Next, a light-emitting layer formation step of forming the light-emitting layer 6 is performed (step S10). In step S10, for example, a material containing the red quantum dots 14R and a photoresist may be applied and patterned by photolithography, thereby forming the red light-emitting layer 6R. The green light-emitting layer 6G and the blue light-emitting layer 6B may be formed by the same technique as that of the red light-emitting layer 6R, by changing the type of quantum dot. In addition, the light-emitting layer 6 may be formed using a known technique such as separately patterning by ink-jet or imprinting.

Figure 5:
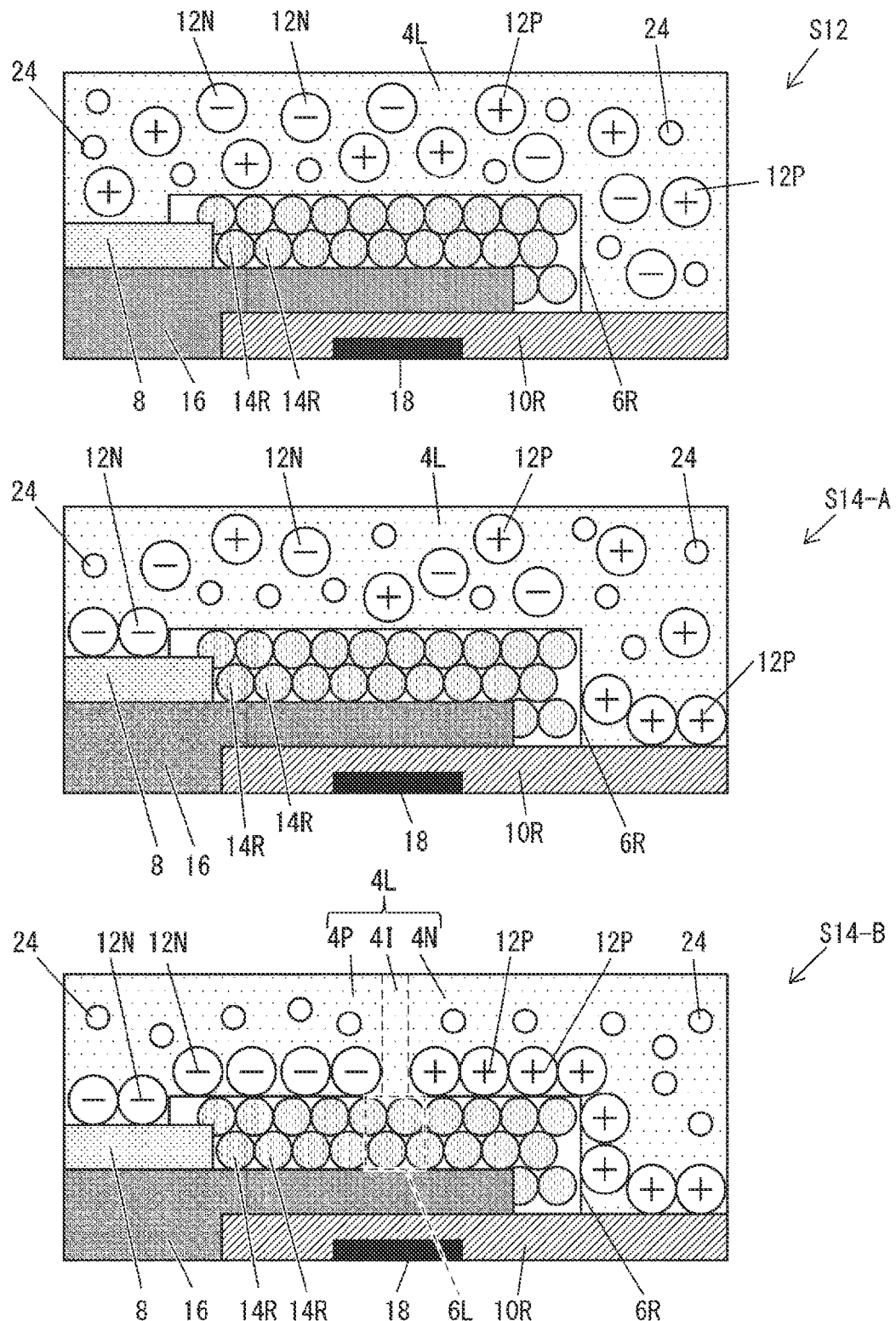
FIG. 5 includes process cross-sectional views for describing the manufacturing method for the display device according to the first embodiment.

Next, a formation step of the ionic layer 4 will be described in detail while referring to process cross-sectional views illustrated in FIG. 5. FIG. 5 includes process cross-sectional views at a position corresponding to FIG. these process cross-sectional views are enlarged cross-sectional views at a position where the red light-emitting element 2R is formed. However, in the present embodiment, the ionic layer 4 is formed by the same technique in any of the light-emitting elements.

In the formation step of the ionic layer 4, an ionic liquid application step of applying an ionic liquid 4L, which is a material of the ionic layer 4, is performed first (step S12). As illustrated in step S12 in FIG. 5, the ionic liquid 4L may contain, for example, the plurality of positive ions 12P, the plurality of negative ions 12N, and the precursors 24.

In the present embodiment, it is preferable that both the negative ions 12N and the positive ions 12P in the ionic liquid 4L have an unsaturated bond such as a double bond. Specifically, the ionic liquid 4L may contain 2-(methacryloyloxy)ethyl trimethyl ammonium 2-acrylamide-2-methyl-1-propane sulfonate (METMA/AMPS). In this case, the ionic liquid 4L may contain polyethylene glycol as the precursor 24, and may contain 2,2-dimetroxy-2 phenylacetophenone (RMPA) as a photoinitiator.

In addition, the ionic liquid 4L may contain 1-butyl-3-methylimidazolium hexafluorophosphate (BMIM-PF6). Alternatively, various known ionic liquids may be employed for the ionic liquid 4L. Specifically, the ionic liquid 4L may include, for example, ions cited in PTL 1 as the ions 12, and may include polymer precursors cited in PTL 1 as the precursors 24. A polymerization initiator may be added to the ionic liquid 4L as necessary.

Next, a voltage application step is performed in which the anode electrode 8 and the cathode electrode 10 are driven to apply a voltage to the ionic liquid 4L (step S14), Step S14 may be performed by, for example, driving all of the subpixel circuits of the array substrate 3 while applying a constant potential to the anode electrode 8 as the common electrode, and forming a potential difference between the anode electrode 8 and all of the cathode electrodes 10.

The ions 12 in the ionic liquid 4L begin to move by applying a voltage to the ionic liquid 4L. Specifically, of the ions 12, the negative ions 12N begin to move toward the anode electrode 8, and the positive ions 12P begin to move toward the cathode electrode 10. Thus, when a certain amount of time has passed since the voltage was applied to the ionic liquid 4L, the negative ions 12N reach the positions adjacent to the anode electrode 8, and the positive ions 12P reach the positions adjacent to the cathode electrode 10, as illustrated in step S14-A in FIG. 5.

In this case, the electric double layer described above is formed between the negative ions 12N and the anode electrode 8 as well as between the positive ions 12P and the cathode electrode 10, and a large electrical field is generated. Due to this electrical field, positive holes are injected into the quantum dots on the anode electrode 8 side of the light-emitting layer 6 from the anode electrode 8, and electrons are injected from the cathode electrode 10 into the quantum dots on the cathode electrode 10 side of the light-emitting layer 6.

The electrons and the positive holes are injected into the ionic liquid 4L from each electrode by the tunneling effect due to the strong electrical field generated by the electric double layer formed by the ions having reached each electrode. Next, as illustrated in step S14-A in FIG. 5, the ions in the ionic liquid 4L are sequentially repositioned to cancel out the charge of the injected electrons and positive holes. Specifically, when the negative ions 12N are rearranged on the anode electrode S side, the p-type doped region 4P grows from the anode electrode 8 side. Meanwhile, when the positive ions 12P are rearranged on the cathode electrode 10 side, the n-type doped region 4N grows from the cathode electrode 10 side.

In a region adjacent to the p-type doped region 4P and the n-type doped region 4N, the electric double layer is formed by the ions 12 in the ionic layer 4. Thus, a strong electrical field is applied to the anode electrode 8 side of the red light-emitting layer 6R in contact with the n-type doped region 4N, the cathode electrode 10R side of the red light-emitting layer 6R in contact with the p-type doped region 4P, and the junction region 4I in the ionic layer 4. With this strong electrical field, electrons are injected to the vicinity of an interface where the red light-emitting layer 6R on the anode electrode 8 side in contact with the n-type doped region 4N makes contact with the ionic layer 4, and holes are injected to the vicinity of an interface where the red light-emitting layer 6R on the cathode electrode 10R side in contact with the p-type doped region 4P makes contact with the ionic layer 4.

Accordingly, when a sufficient amount of time has passed since the voltage was applied to the ionic liquid 4L, the negative ions 12N reach the anode electrode 8 and the positions adjacent to the anode electrode $ side of the light-emitting layer 6, as illustrated in step S14-B in FIG. 5. Likewise, the positive ions 12P reach the cathode electrode 10 and the positions adjacent to the cathode electrode 10 side of the light-emitting layer 6, as illustrated in step S14-B in FIG. 5.

Thus, as illustrated in step S14-B in FIG. 5, at the completion of step S14, the p-type doped region 4P and the n-type doped region 4N are formed in the ionic liquid 4L. A region in which there is no concentration difference between the negative ions 12N and the positive ions 12P is formed at a position where the electrons and the positive hole are recombined in the light-emitting layer 6. Thus, as illustrated in step S14-B in FIG. 5, at the completion of step S14, the junction region 4I is formed between the p-type doped region 4P and the n-type doped region 4N. Along with this, in a plan view, the light-emitting region 6L is formed at a position of the red light-emitting layer 6R overlapping with the junction region 4I.

Subsequently, while the voltage application in step S14 is continued, at least part of the precursors 24 is cured. In this way, an ionic layer formation step is performed in which the ionic layer 4 is formed by curing the ionic liquid 4L (step S16). Step S16 may be performed, for example, by irradiating the precursors 24, which are monomers, with light to form the polymeric resin 4S. In step S14, when the electrons and the positive holes are recombined in the quantum dots of each light-emitting layer 6 and light emission from each light-emitting layer 6 is obtained, a shift from step S14 to step S16 may be performed. When step S16 is completed, the formation of the light-emitting element 2 on the array substrate 3 is completed.

Finally, the sealing layer 22 is formed (step S18), and thus the display device 1 is obtained. The sealing layer 22 may be film-formed by the CVD technique or the like using, for example, an inorganic material having moisture-proof properties.

The light-emitting element 2 according to the present embodiment includes the solid ionic layer 4 having the p-type doped region 4P, the n-type doped region 4N, and the junction region 4I, any of which is adjacent to the light-emitting layer 6. Thus, by driving the anode electrode 8 and the cathode electrode 10, an electric double layer is generated between the p-type doped region 4P and the anode electrode 8 as well as the anode electrode 8 side of the light-emitting layer 6, and between the n-type doped region 4N and the cathode electrode 10 as well as the cathode electrode 10 side of the light-emitting layer 6.

Therefore, the positive holes and electrons are easily injected into the light-emitting layer 6, and the positive holes and electrons in the light-emitting layer 6 are easily transported. Thus, in the light-emitting element 2 according to the present embodiment, the positive holes and electrons are efficiently recombined in the light-emitting layer 6, thereby improving luminous efficiency.

The light-emitting element 2 according to the present embodiment does not require strict control of the band structure of each layer compared to a known layered type electroluminescent element containing no ion, and therefore may be simply constituted. Furthermore, the light-emitting element 2 according to the present embodiment is capable of being driven at a voltage lower than that of the known electroluminescent element, thereby leading to a reduction in power consumption.

The light-emitting element 2 according to the present embodiment includes the solid ionic layer 4. In other words, the positional relationship of the p-type doped region 4P, the n-type doped region 4N, and the junction region 4I is unchanged regardless of whether to drive the light-emitting element 2. Thus, in comparison with an electrochemical light-emitting element including a known liquid, the time for rearranging the ions in the ionic liquid is unnecessary at the drive time.

Therefore, the light-emitting element 2 according to the present embodiment improves the response speed compared to the electrochemical light-emitting element including the known liquid. In the light-emitting element 2 according to the present embodiment, because there is no movement of the ions 12 in the ionic layer 4 compared to the electrochemical light-emitting element including the known liquid, a decrease in luminous efficiency due to an electrochemical reaction of the electrolyte is unlikely to occur.

The display device 1 including the above-described light-emitting element 2 may improve, while improving luminous efficiency, the response speed and provide display with improved display quality. In the present embodiment, the display device 1 including the light-emitting element 2 for each pixel has been exemplified and described. However, the present disclosure is not limited thereto, and the light-emitting element 2 according to the present embodiment may be applied to a light-emitting device including a single light-emitting element such as illumination.

As illustrated in the description of the formation step of the ionic layer 4, the p-type doped region 4P and the n-type doped region 4N are formed by applying a voltage to the ionic liquid 4L and causing the ionic liquid 4L to cure while causing the negative ions 12N and the positive ions 12P to be present unevenly. Thus, in the p-type doped region 4P, the negative ions 12N may increase in quantity toward the anode electrode 8. In the n-type doped region 4N, the positive ions 12P may increase in quantity toward the cathode electrode 10.

With the configuration described above, the electric double layer is more efficiently formed between the anode electrode 8 and the p-type doped region 4P and between the cathode electrode 10 and the n-type doped region 4N at the drive time of the light-emitting element 2. As a result, the injection of positive holes from the anode electrode 8 into the light-emitting layer 6 and the injection of electrons from the cathode electrode 10 into the light-emitting layer 6 become easier.

In the present embodiment, the configuration in which the ionic layer 4 makes direct contact with the anode electrode 8 and the cathode electrode 10 has been exemplified and described. However, the present embodiment is not limited thereto, and the ionic layer 4 and the anode electrode 8 may be adjacent to each other via a thin film of the hole transport layer formed between the ionic layer 4 and the anode electrode 8. Likewise, in the present embodiment, the ionic layer 4 and the cathode electrode 10 may be adjacent to each other via a thin film of the electron transport layer formed between the ionic layer 4 and the cathode electrode 10.

In the present embodiment, the configuration in which the red light-emitting layer 6R, the green light-emitting layer 6G, and the blue light-emitting layer 6B are individually formed for each sub light-emitting element has been exemplified and described. However, the present embodiment is not limited thereto: the light-emitting layer 6 may be formed common to all of the sub light-emitting elements, and the light-emitting layer 6 may include the red quantum dots 14R, the green quantum dots 14G, and the blue quantum dots 14B in a mixed state.

In this case, red light from the red quantum dots 14R, green light from the green quantum dots 14G, and blue light from the blue quantum dots 14B are obtained from each of the sub light-emitting elements. The light-emitting element 2 may include a color filter between the ionic layer 4 and the sealing layer 22. With the above configuration, also in the case where the light-emitting layer 6 includes the red quantum dots 14R, the green quantum dots 14G, and the blue quantum dots 14B in a mixed state, only the light emission of a specific color may be extracted from each sub light-emitting element.

In the present embodiment, the anode electrode 8 has a rectangular opening in a plan view, and each cathode electrode 10 has a shape corresponding to the opening of the anode electrode 8. However, the present embodiment is not limited thereto, and the outer shape of at least one of the anode electrode 8 and the cathode electrode 10 may include projections and recesses in a plan view.

Figure 6:
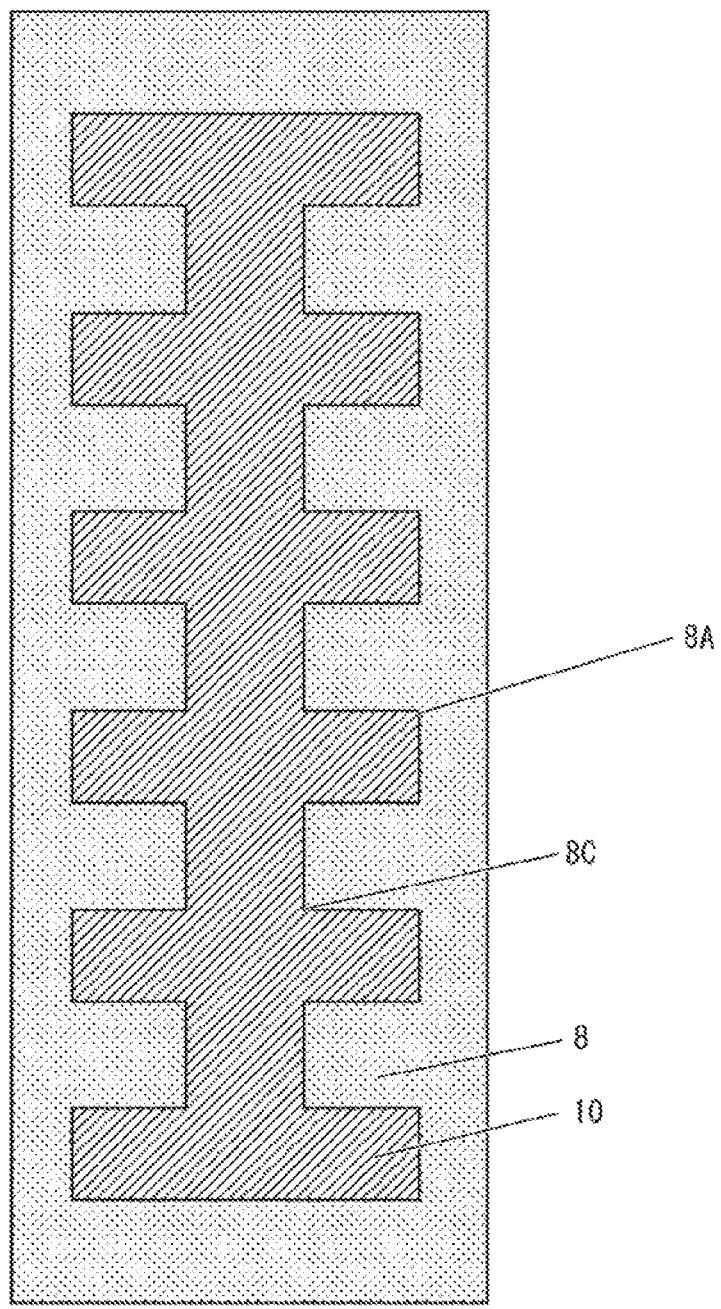
FIG. 6 is a schematic plan view for illustrating another example of shapes of a cathode electrode and an anode electrode of the display device according to the first embodiment.
Figure 7:
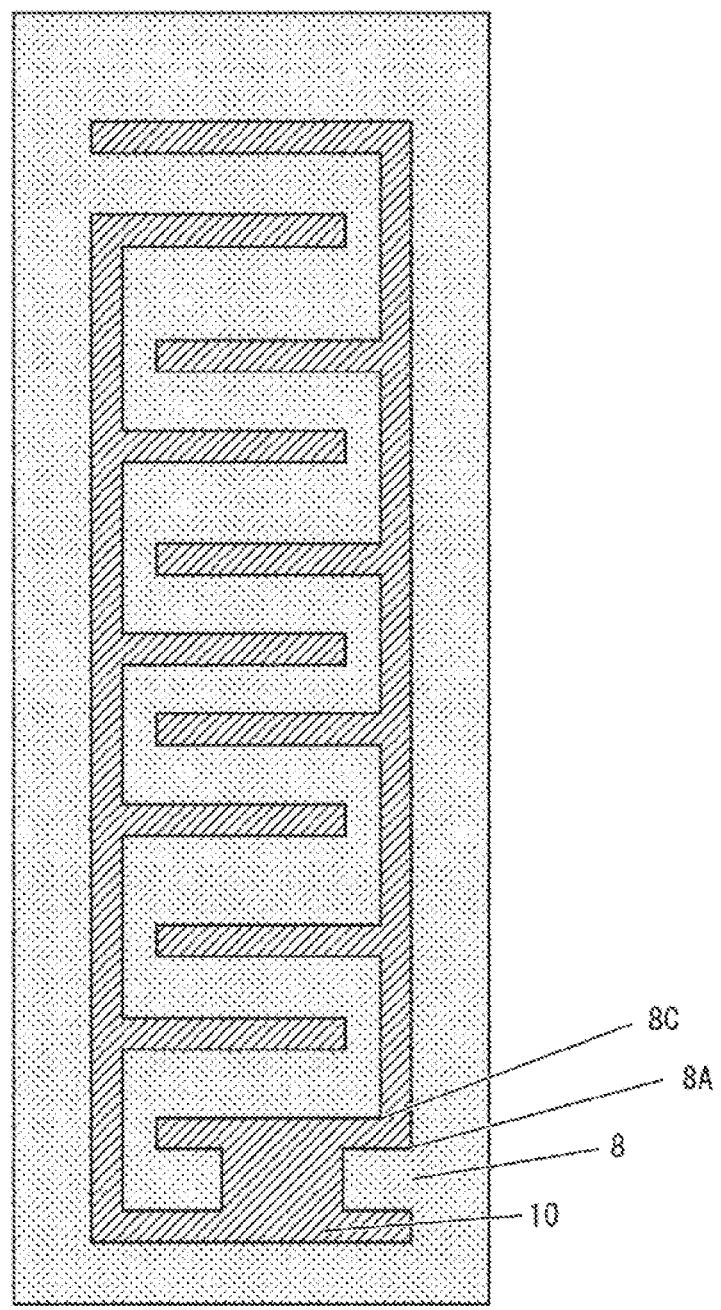
FIG. 7 is another schematic plan view for illustrating another example of a cathode electrode and an anode electrode of the display device according to the first embodiment.

Specific examples of other shapes of the anode electrode 8 and the cathode electrode 10 are respectively depicted in FIG. 6 and FIG. 7, As depicted in FIG. 6 and FIG. 7, for example, the anode electrode 8 may include projections and recesses in a plan view. In other words, as depicted in FIG. 6 and FIG. 7, the anode electrode 8 may include, on the outer shape thereof, a plurality of bending parts 8A having an exterior angle of the bent portion greater than 180 degrees, and a plurality of bending parts 8C having an exterior angle of the bent portion less than 180 degrees, in a plan view.

Modified Example 1

Figure 8:
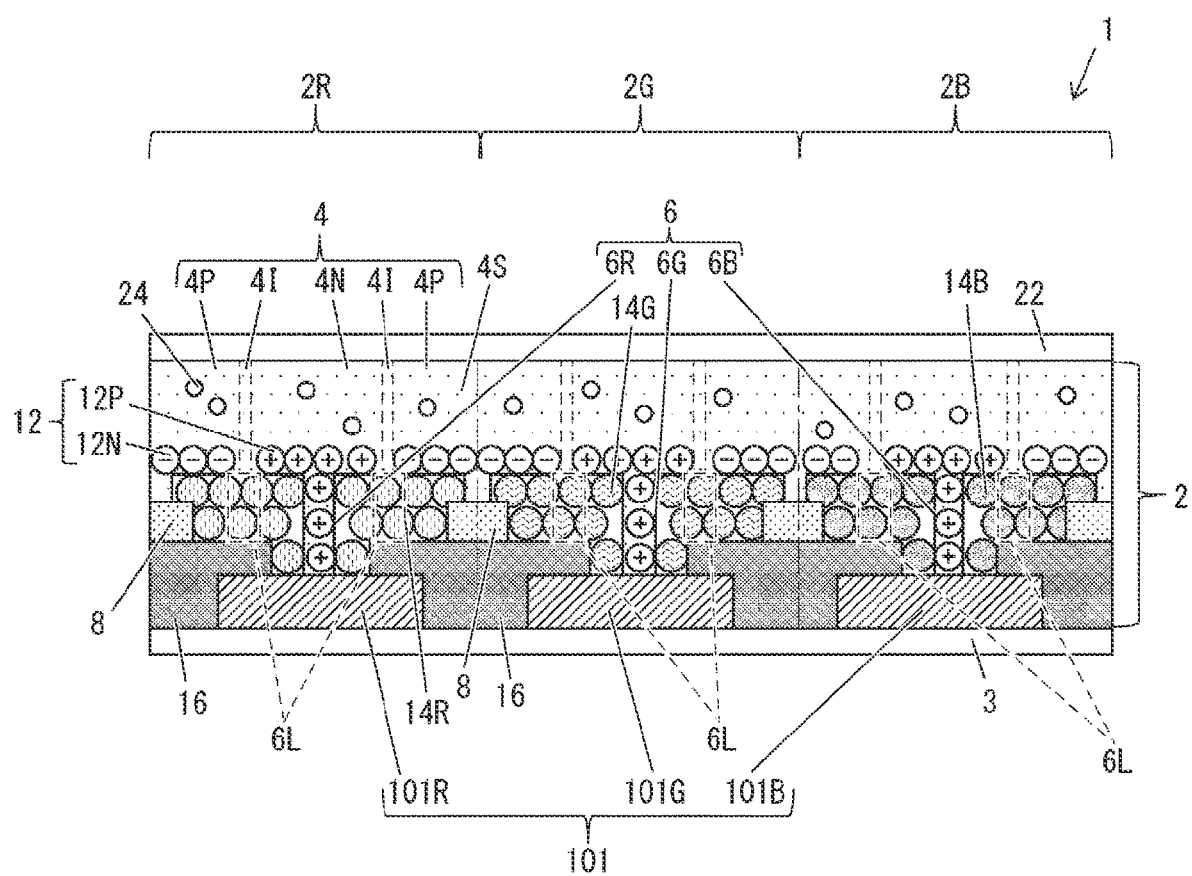
FIG. 8 is a schematic cross-sectional view of a display device according to Modified Example 1.

FIG. 8 is a schematic cross-sectional view of a display device 1 according to the present modified example, and is a schematic cross-sectional view at a position corresponding to FIG. 1. In the present modified example, as illustrated in FIG. 8, the display device 1 includes a cathode electrode 101, which is a reflective electrode, instead of the cathode electrode 10. Except for this point, the display device 1 according to the present modified example has the same configuration as the display device 1 according to the present embodiment. With this, light from each of the light-emitting layers 6 is reflected at any position in the cathode electrode 101, and therefore the light extraction efficiency at the upper side of the light-emitting element 2 is further improved. Because of this, it is unnecessary for the cathode electrode 101 to include the reflective layer 18.

Modified Example 2

Figure 9:
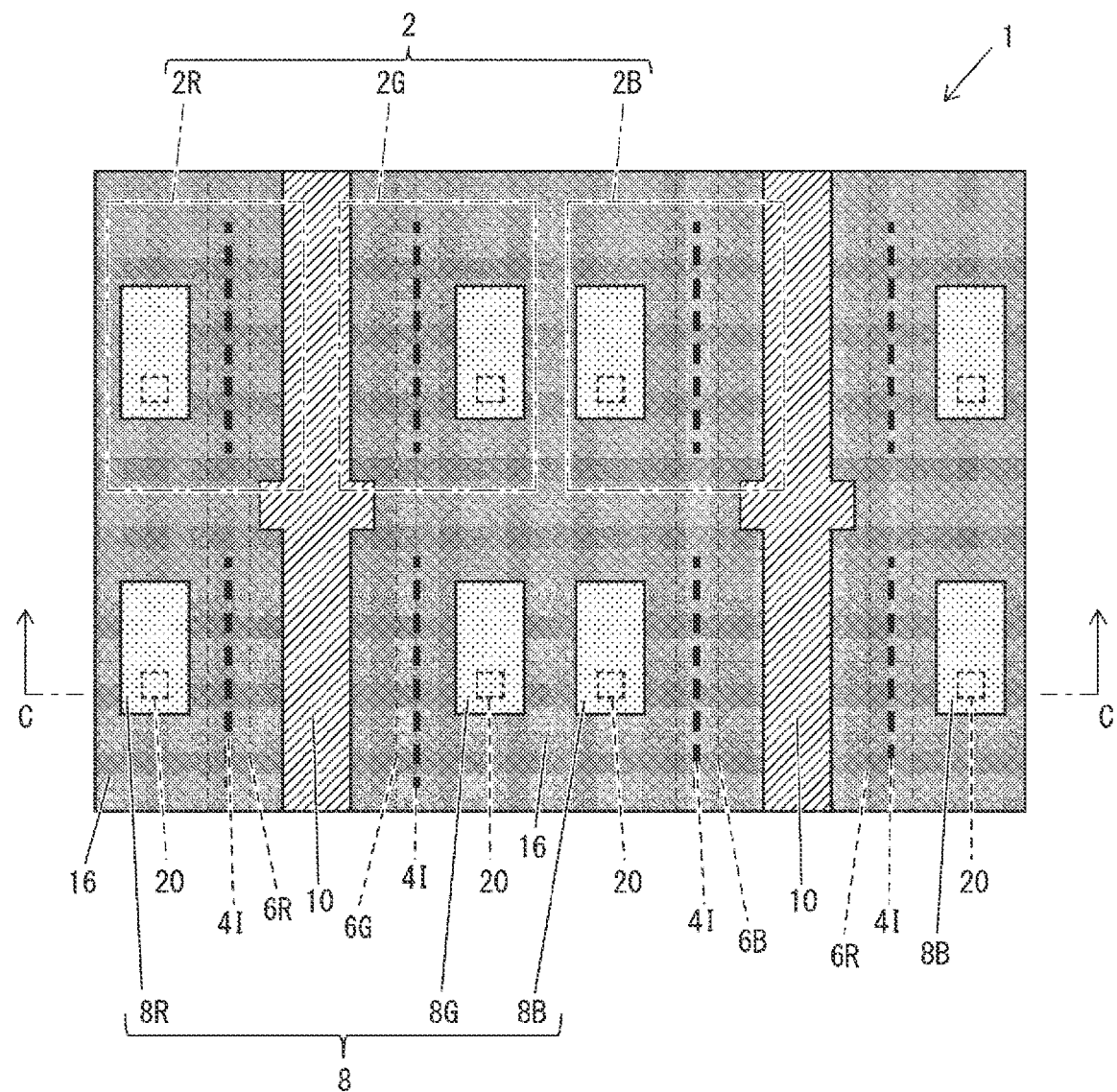
FIG. 9 is a schematic plan view of a display device according to Modified Example 2.
Figure 10:
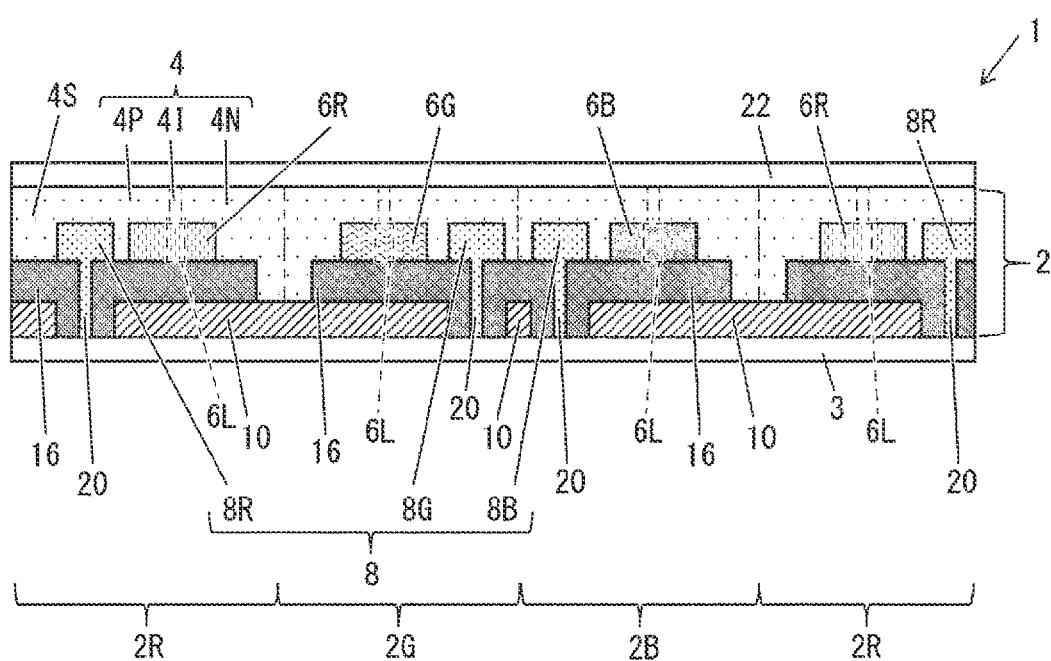
FIG. 10 is a schematic cross-sectional view of the display device according to Modified Example 2.

FIG. 9 is a schematic plan view of a display device 1 according to the present modified example. FIG. 10 is a schematic cross-sectional view of the display device 1 according to the present modified example, and is a cross-sectional view taken along an arrow line C-C in FIG. 9. In FIG. 10, ions 12 and precursors 24 of an ionic layer 4 are not illustrated.

In the present modified example, similar to the display device 1 according to the present embodiment, the display device 1 includes a light-emitting element 2 on an array substrate 3, and includes a sealing layer 22 on the light-emitting element 2.

In the present modified example, as illustrated in FIG. 9 and FIG. 10, the light-emitting element 2 includes an anode electrode 8 formed in an island shape for each of sub light-emitting elements. Specifically, the light-emitting element 2 includes an anode electrode 8R for a red light-emitting element 2R, an anode electrode 8G for a green light-emitting element 2G, and an anode electrode 8B for a blue light-emitting element 2B. Each anode electrode 8 is connected to each of subpixel circuits of the array substrate 3 via a contact portion 20 formed in an insulating layer 16. In the present modified example, the light-emitting element 2 includes a cathode electrode 10 common to the sub light-emitting elements.

In the present modified example, the light-emitting layer 6 does not directly make contact with the anode electrode 8 and the cathode electrode 10. Specifically, as illustrated in FIG. 10, a p-type doped region 4P is formed between the light-emitting layer 6 and the anode electrode 8, and an n-type doped region 4N is formed between the light-emitting layer 6 and the cathode electrode 10. The light-emitting element 2 of the present modified example is the same as the light-emitting element 2 according to the present embodiment in a point that a light-emitting region 61, is provided at a position where the light-emitting layer 6 and a junction region 4I of the ionic layer 4 are adjacent to each other, and the light-emitting layer 6 overlaps with the junction region 4I in a plan view.

In the present modified example, each light-emitting layer 6 is formed common to the sub light-emitting elements of the same color adjacent to each other. Specifically, for example, as illustrated in FIG. 9, a red light-emitting layer 6R is formed to be common at a position where the red light-emitting layer 6R overlaps the junction regions 4I respectively formed in the red light-emitting elements 2R adjacent to each other in a plan view. Further, as illustrated in FIG. 9, a green light-emitting layer 6G and a blue light-emitting layer 6B are each formed to be common at a position where the green light-emitting layer 6G and the blue light-emitting layer 6B each overlap the junction regions 4I respectively formed in the sub light-emitting elements of the same color adjacent to each other in a plan view.

In the present modified example, part of the cathode electrode 10 is exposed from an insulating layer 16 in a plan view. As illustrated in FIG. 911, a plurality of the cathode electrodes 10 exposed from the insulating layer 16 are formed parallel to the longitudinal direction of each of the light-emitting layers 6 in a plan view. In the present modified example, the light-emitting elements 2 of two colors among the red light-emitting element 2R, green light-emitting element 2G, and blue light-emitting element 2B are formed between two cathode electrodes 10 close to each other and exposed from the insulating layers 16. Thus, the display device 1 according to the present modified example includes one junction region 4I in each sub light-emitting element.

Except for the above point, the display device 1 according to the present modified example has the same configuration as the display device 1 according to the present embodiment.

The display device 1 according to the present modified example may be manufactured by the same manufacturing method as that of the display device 1 according to the present embodiment by changing the formation position of each of the members. Specifically, the display device 1 according to the present modified example may be manufactured by performing the steps illustrated in FIG. 4.

In the present modified example, in step S12, the light-emitting layer 6 is separated from the anode electrode 8 and the light-emitting layer 6 is also separated from the cathode electrode 10 by the ionic liquid 4L, so that the light-emitting layer 6 does not directly make contact with each electrode. However, in step S14, when a voltage is applied to the ionic liquid 4L, the negative ions 12N move to the ionic liquid 4L between the light-emitting layer 6 and the anode electrode 8, and the positive ions 12P move to the ionic liquid 4L between the light-emitting layer 6 and the cathode electrode 10.

As a result, an electric double layer is formed by the positive holes of the anode electrode 8 and the negative ions 12N, so that the positive holes from the anode electrode 8 may easily move to the ionic liquid 4L between the light-emitting layer 6 and the anode electrode 8 by a strong electrical field generated by the electric double layer. Likewise, an electric double layer is formed by the electrons of the cathode electrode 10 and the positive ions 12P, so that the electrons from the cathode electrode 10 may easily move to the ionic liquid 4L between the light-emitting layer 6 and the cathode electrode 10 by a strong electrical field generated by the electric double layer.

As described above, also in the present modified example, it is possible to form the ionic layer 4 including the p-type doped region 4P, the n-type doped region 4N, and the junction region 4I in the same manner as the formation step of the ionic layer 4 in the present embodiment. Thus, in the light-emitting element 2 according to the present modified example, when a voltage is applied between the anode electrode 8 and the cathode electrode 10, the positive holes from the anode electrode 8 are easily injected into the light-emitting layer 6 via the p-type doped region 4P. Likewise, in the light-emitting element 2 according to the present modified example, when a voltage is applied between the anode electrode 8 and the cathode electrode 10, the electrons from the cathode electrode 10 are easily injected into the light-emitting layer 6 via the n-type doped region 4N.

The light-emitting element 2 according to the present modified example exhibits the same effect as that of the light-emitting element 2 according to the present embodiment. In addition, the light-emitting element 2 according to the present modified example includes the light-emitting layer 6 common to some sub light-emitting elements of the same color adjacent to each other. Due to this, the light-emitting element 2 according to the present modified example may simplify the formation step of the light-emitting layer 6.

Modified Example 3

Figure 11:
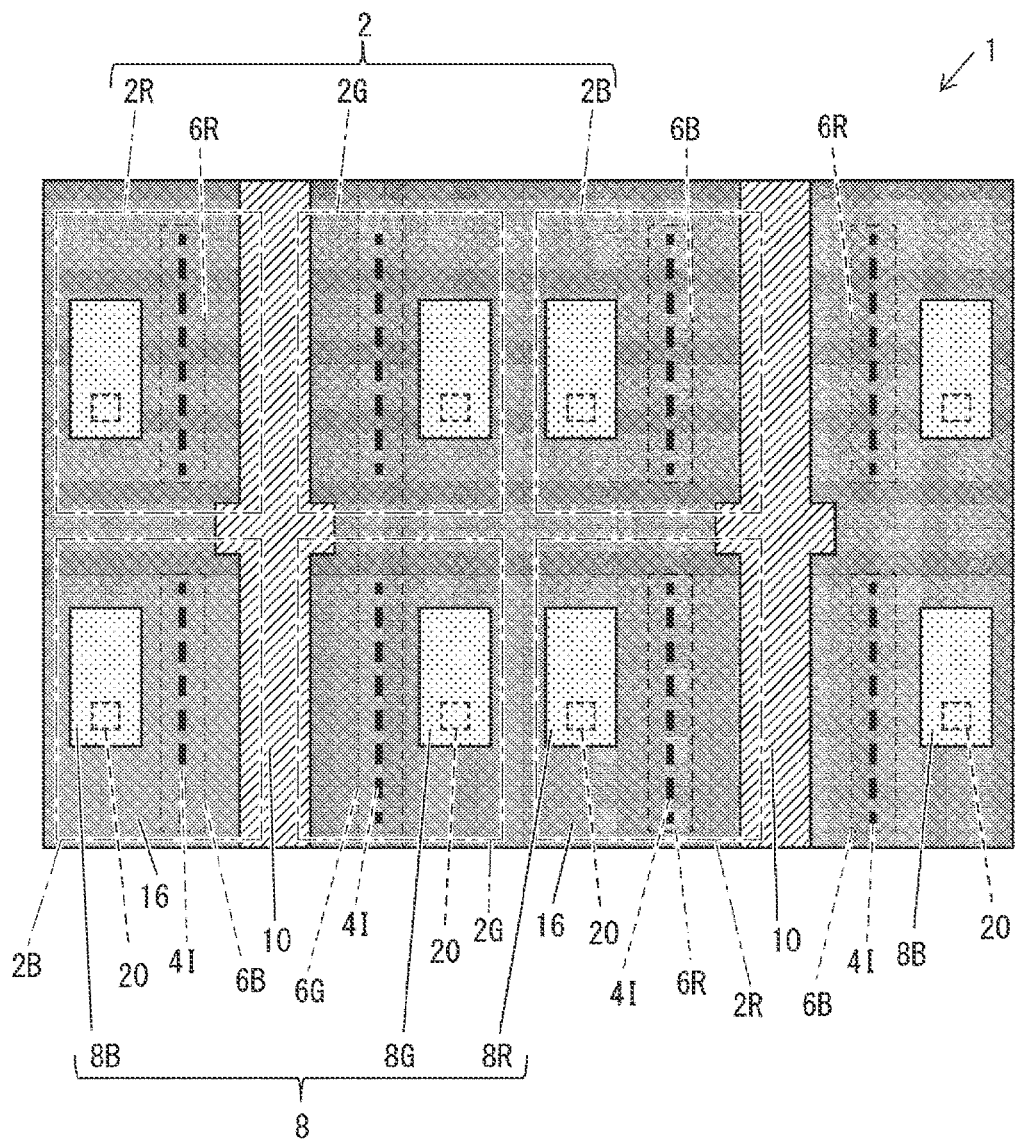
FIG. 11 is a schematic plan view of a display device according to Modified Example 3.

FIG. 11 is a schematic plan view of a display device 1 according to the present modified example.

As illustrated in FIG. 11, in the display device 1 according to the present modified example, a red light-emitting layer 6R and a blue light-emitting layer 6B are individually formed in each sub light-emitting element as compared to the display device 1 according to the previous modified example. In addition, in the display device 1 according to the present modified example, a red light-emitting element 2R and a blue light-emitting element 2B are alternately arranged in parallel with each of green light-emitting layers 6G. Because of this, the red light-emitting layer 6R and the blue light-emitting layer 6B do not come close to each other in a direction parallel to the green light-emitting layer 6G.

Except for the above point, the display device 1 according to the present modified example has the same configuration as the display device 1 according to the previous modified example. In particular, the display device 1 according to the present modified example includes the green light-emitting layer 6G common to some of a plurality of green light-emitting elements 2G. Specifically, as illustrated in FIG. 11, in the display device 1 according to the present modified example, the red light-emitting element 2R, the green light-emitting element 2G, and the blue light-emitting element 2B may be arranged by a scheme generally referred to as a PenTile scheme.

The light-emitting element 2 according to the present modified example exhibits the same effect as that of the light-emitting element 2 according to the present embodiment. In addition, in the present modified example, because the red light-emitting element 2R and the blue light-emitting element 2B do not come close to each other in the direction parallel to the green light-emitting layer 6G, the display device 1 according to the present modified example may reduce color unevenness and perform display with improved display quality.

Modified Example 4

Figure 12:
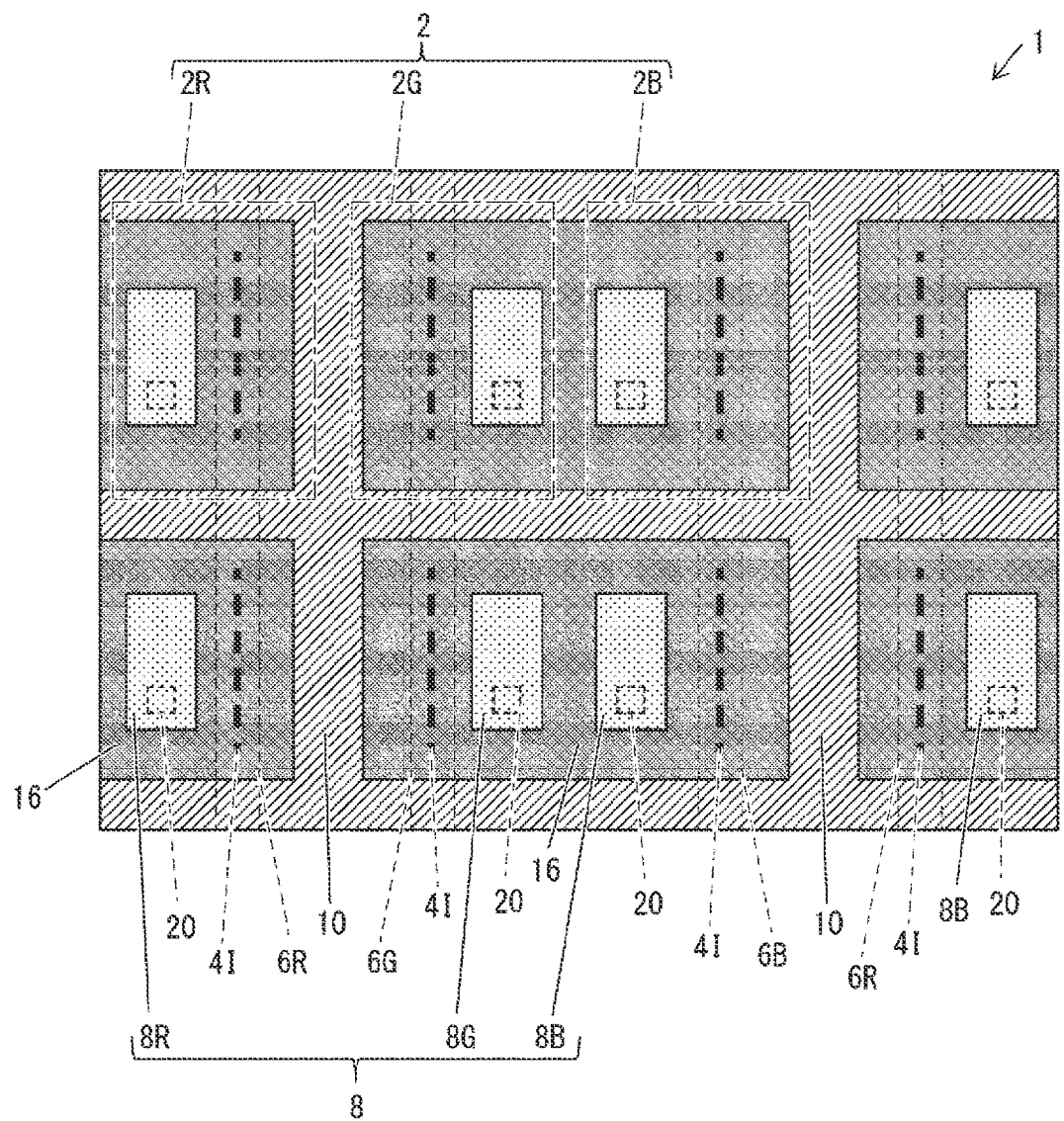
FIG. 12 is a schematic plan view of a display device according to Modified Example 4.

FIG. 12 is a schematic plan view of a display device 1 according to the present modified example.

As illustrated in FIG. 12, in the display device 1 according to the present modified example, a cathode electrode 10 exposed from an insulating layer 16 is formed also in a direction perpendicularly crossing the longitudinal direction of each of the light-emitting layers 6 in a plan view, as compared to the display device 1 according to Modified Example 1. Thus, in the display device 1 according to the present modified example, the cathode electrode 10 exposed from the insulating layer 16 is formed at a position covering two light-emitting elements each of the red light-emitting elements 2R, the green light-emitting elements 2G, and the blue light-emitting elements 2B in a plan view.

Except for the above point, the display device 1 according to the present modified example has the same configuration as the display device 1 according to Modified Example 1.

The light-emitting element 2 according to the present modified example exhibits the same effect as that of the light-emitting element 2 according to the present embodiment. In addition, in the present modified example, each sub light-emitting element is defined by the cathode electrode 10 exposed from the insulating layer 16 in the longitudinal direction of each of the light-emitting layers 6. Thus, the display device 1 according to the present modified example reduces crosstalk between the light-emitting elements 2 adjacent to each other.

Modified Example 5

Figure 13:
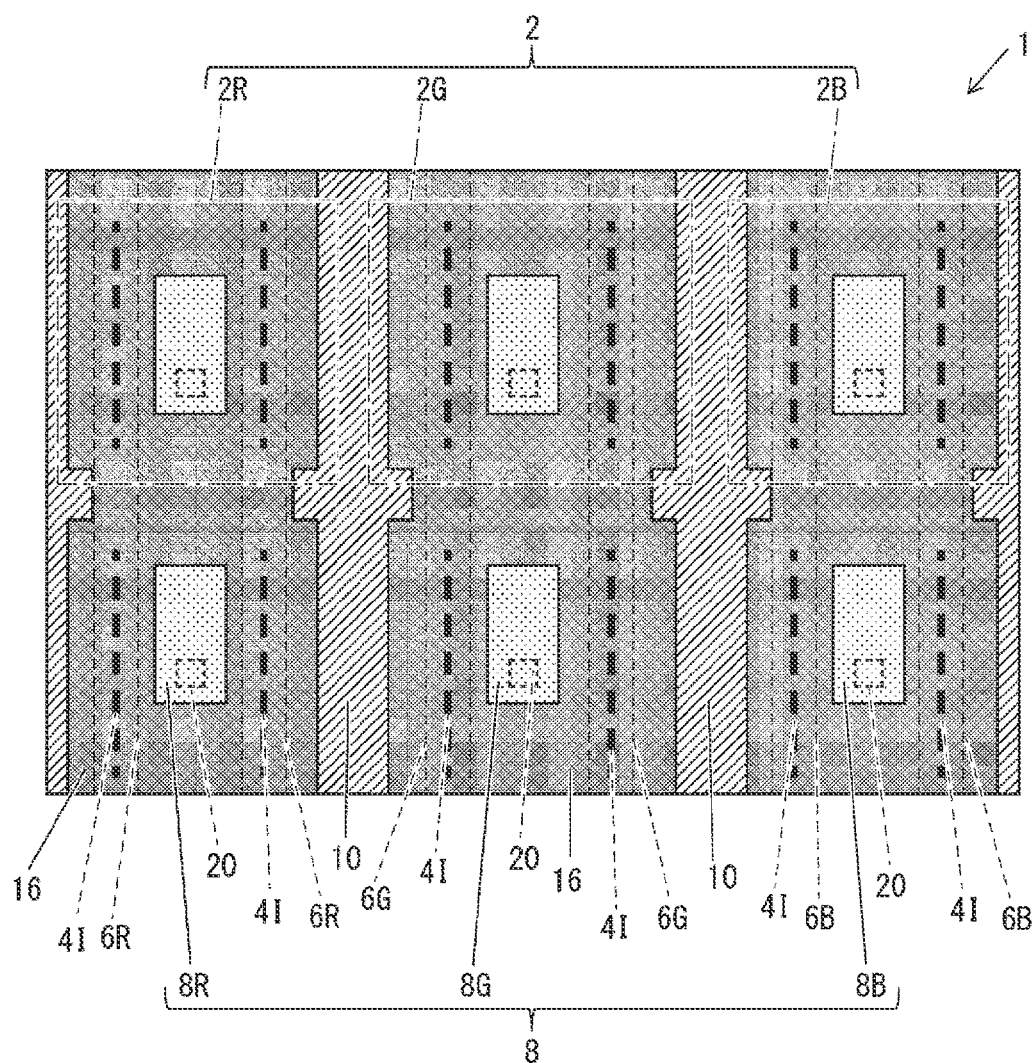
FIG. 13 is a schematic plan view of a display device according to Modified Example 5.

FIG. 13 is a schematic plan view of a display device 1 according to the present modified example.

As illustrated in FIG. 13, in the display device 1 according to the present modified example, of anode electrodes 8, only an anode electrode 8 corresponding to light-emitting elements 2 of the same color is formed between cathode electrodes 10 exposed from insulating layers 16 close to each other in a plan view, as compared to the display device 1 according to Modified Example 1. Due to this, as illustrated in FIG. 13, the display device 1 according to the present modified example includes the cathode electrodes 10 exposed from the insulating layers 16 on both sides of each anode electrode 8 in a plan view.

Thus, the display device 1 according to the present modified example includes two junction regions 4I in each sub light-emitting element in a plan view, as illustrated in FIG. 13. Along with this, in the display device 1 according to the present modified example, two light-emitting layers 6 each of the same color are provided between the cathode electrodes 10 exposed from the insulating layers 16 close to each other in a plan view.

Except for the above point, the display device 1 according to the present modified example has the same configuration as the display device 1 according to Modified Example 1.

The light-emitting element 2 according to the present modified example exhibits the same effect as that of the light-emitting element 2 according to the present embodiment. Further, in the present modified example, the light-emitting layers 6 of different colors are not provided between the cathode electrodes 10 exposed from the insulating layers 16 close to each other in a plan view. Thus, the display device 1 according to the present modified example reduces crosstalk or color mixing between the light-emitting elements 2 adjacent to each other. Furthermore, because each of the light-emitting elements 2 according to the present modified example includes two junction regions 4I, an area in a plan view of the light-emitting region 6L is increased, thereby making it possible to more improve the luminous efficiency.

Modified Example 6

Figure 14:
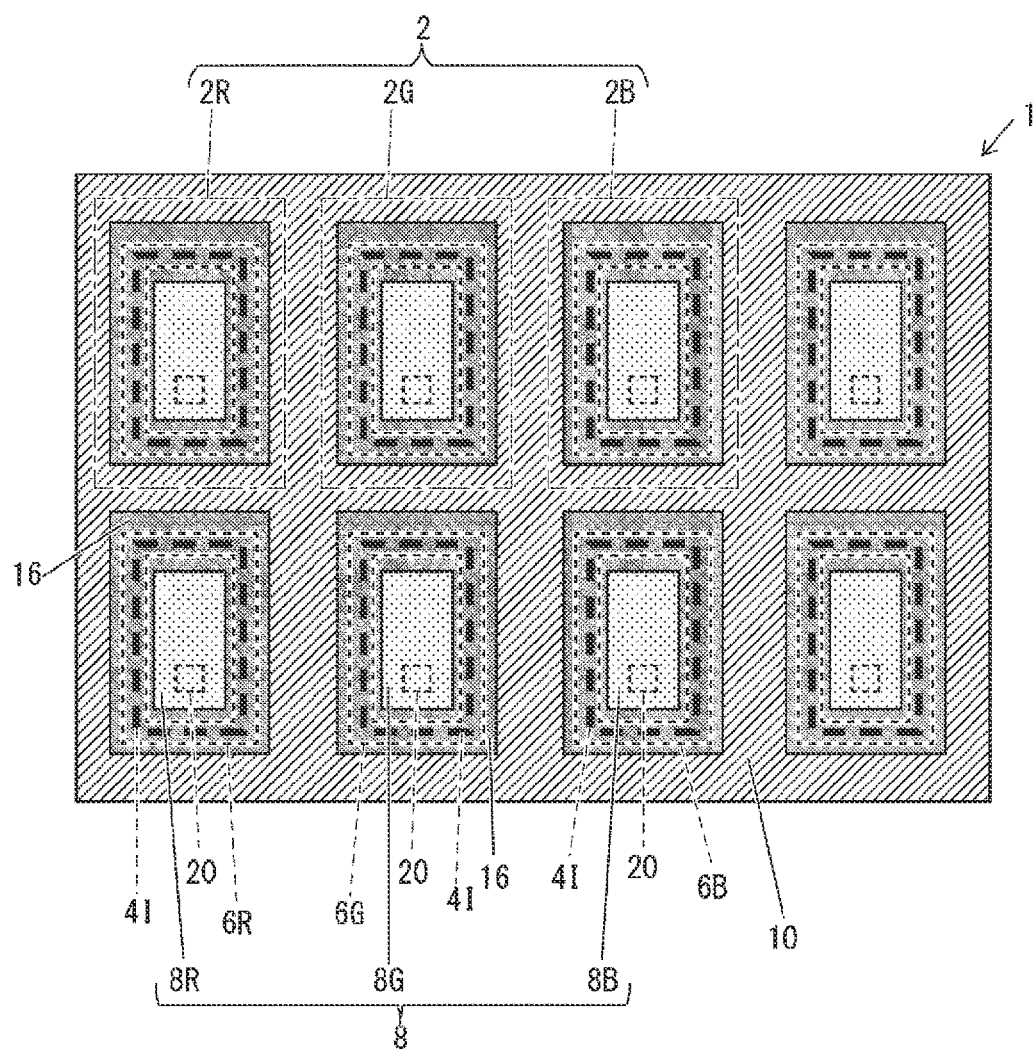
FIG. 14 is a schematic plan view of a display device according to Modified Example 6.

FIG. 14 is a schematic plan view of a display device 1 according to the present modified example.

As illustrated in FIG. 14, in the display device 1 according to the present modified example, a cathode electrode 10 exposed from an insulating layer 16 is formed at a position surrounding each of anode electrodes 8 in a plan view, as compared to the display device 1 according to Modified Example 1. Due to this, as illustrated in FIG. 14, the display device 1 according to the present modified example includes a junction region 4I at a position surrounding each anode electrode 8 in a plan view. Along with this, the display device 1 according to the present modified example includes each of light-emitting layers 6 at a position surrounding each anode electrode 8 in a plan view.

Except for the above point, the display device 1 according to the present modified example has the same configuration as the display device 1 according to Modified Example 1.

The light-emitting element 2 according to the present modified example exhibits the same effect as that of the light-emitting element 2 according to the present embodiment. In addition, in the present modified example, each light-emitting layer 6 is defined by the cathode electrode 10 exposed from the insulating layer 16 in a plan view. Thus, the display device 1 according to the present modified example reduces crosstalk or color mixing between the light-emitting elements 2 adjacent to each other. Furthermore, because each of the light-emitting elements 2 according to the present modified example includes the junction region 4I around each anode electrode 8, an area in a plan view of the light-emitting region 6L is increased, thereby making it possible to more improve the luminous efficiency.

Second Embodiment

Figure 15:
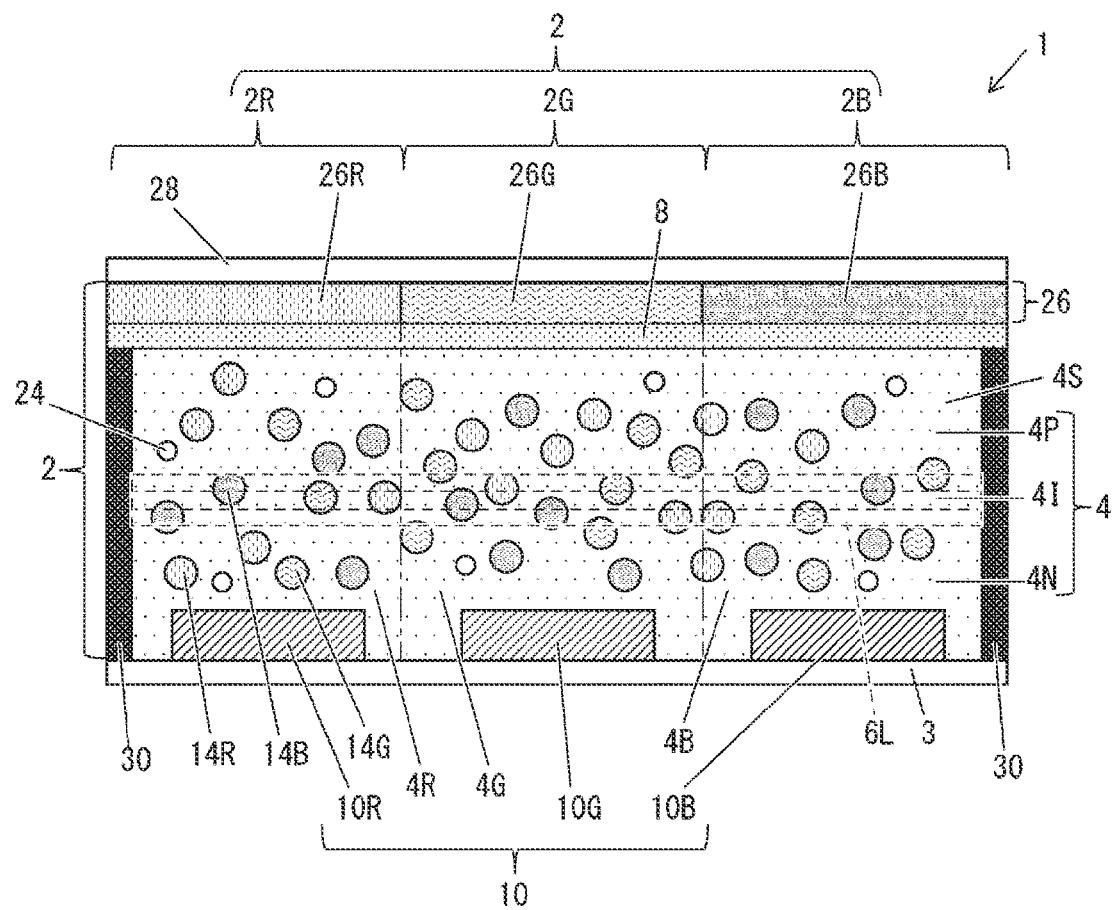
FIG. 15 is a schematic cross-sectional view of a display device according to a second embodiment.

FIG. 15 is a schematic cross-sectional view of a display device 1 according to the present embodiment. In the following embodiments, the same reference numerals are assigned to members having the same functions as those illustrated in the above-described embodiment. Further, the members assigned with the same reference numerals as those of the members illustrated in the above-described embodiment will be described in detail with respect to only different points from the members illustrated in the above-described embodiment, and the same configurations will not be described in detail. Note that in FIG. 15, ions 12 of an ionic layer 4 are not illustrated.

In the present embodiment, similar to the previous embodiment, the display device 1 includes a light-emitting element 2 on an array substrate 3. The display device 1 further includes a counter substrate 28 opposing the array substrate 3 across the light-emitting element 2. In the present embodiment, the counter substrate 28 is a substrate having a transmitting property such as a glass substrate or a transparent film substrate including a PET film, a polyimide film or the like.

In the present embodiment, similar to the previous embodiment, the light-emitting element 2 includes the ionic layer 4. The ionic layer 4 according to the present embodiment includes a resin 4S, and further includes red quantum dots 14R, green quantum dots 14G, blue quantum dots 14B, and precursors 24 in the resin 4S. In other words, the ionic layer 4 according to the present embodiment also has a function of the light-emitting layer 6 according to the previous embodiment.

In addition, in the present embodiment, the light-emitting element 2 includes a plurality of cathode electrodes 10 and an anode electrode 8 common to the cathode electrodes 10, and the ionic layer 4 described above is provided between the cathode electrode 10 and the anode electrode 8. The ionic layer 4 is sealed between the cathode electrode 10 and the anode electrode 8 by a sealing member 30 formed between the array substrate 3 and the anode electrode 8, and on the peripheral end portion of the array substrate 3 in a plan view.

In the present embodiment, the cathode electrode 10 is a reflective electrode, and the anode electrode 8 is a transmitting electrode. Further, in the present embodiment, the cathode electrode 10 may be driven by a subpixel circuit formed for each sub light-emitting element on the array substrate 3, and a constant voltage may be applied to the anode electrode 8.

The ionic layer 4 according to the present embodiment includes a p-type doped region 4P, an n-type doped region 4N, and a junction region 4I, similar to the ionic layer 4 according to the previous embodiment. The ionic layer 4 includes the p-type doped region 4P on the anode electrode S side, includes the n-type doped region 4N on the cathode electrode 10 side, and includes the junction region 4I between the p-type doped region 4P and the n-type doped region 4N.

Further, in the present embodiment, the ionic layer 4 includes a light-emitting region 6L at a position including the junction region 4I and a location adjacent to the junction region 4I. Specifically, for example, as illustrated in FIG. 15, the light-emitting region 6L is formed on the junction region 4I and the location close to the junction region 4I.

The light-emitting element 2 according to the present embodiment further includes a color filter 26 on an upper layer of the anode electrode 8. The color filter 26 includes a red color filter 26R configured to transmit red light, a green color filter 26G configured to transmit green light, and a blue color filter 26B configured to transmit blue light. The color filter 26 may have the same configuration as a color filter used in a known display device.

In the present embodiment, the light-emitting element 2 includes a red light-emitting element 2R at a position overlapping with the red color filter 26R in a plan view. In the red light-emitting element 2R, a cathode electrode 10R of the cathode electrode 10 is formed. Similarly, in a plan view, the light-emitting element 2 includes a green light-emitting element 2G at a position overlapping with the green color filter 26G, and includes a blue light-emitting element 2B at a position overlapping with the blue color filter 26B. In the green light-emitting element 2G, a cathode electrode 10G of the cathode electrode 10 is formed. In the blue light-emitting element 2B, a cathode electrode 10B of the cathode electrode 10 is formed.

Thus, in the present embodiment, the ionic layer 4 includes a red ionic layer 4R in the red light-emitting element 2R, and includes a green ionic layer 4G in the green light-emitting element 2G, and includes a blue ionic layer 4B in the blue light-emitting element 2B. Note that the ionic layer 4 includes the red quantum dots 14R, the green quantum dots 14G, and the blue quantum dots 14B in a mixed state common to all of the light-emitting elements 2. In other words, the red ionic layer 4R, the green ionic layer 4G, and the blue ionic layer 4B are each provided with the red quantum dots 14R, green quantum dots 14G, and blue quantum dots 14B. Furthermore, any of the red ionic layer 4R, green ionic layer 4G, and blue ionic layer 4B shares the p-type doped region 4P and the n-type doped region 4N.

In particular, the ionic layer 4 includes the red quantum dots 14R, green quantum dots 14G, and blue quantum dots 14B in the junction region 4I or at a location adjacent to the junction region 4I. Specifically, for example, the ionic layer 4 includes the red quantum dots 14R, green quantum dots 14G, and blue quantum dots 14B in the junction region 4I or at a location close to the junction region 4I. To rephrase, the ionic layer 4 includes the red quantum dots 14R, the green quantum dots 14G, and the blue quantum dots 14B in the light-emitting region 6L.

In the present embodiment as well, it is possible for the display device 1 to individually drive each of the sub light-emitting elements by driving each of the cathode electrodes 10 and the anode electrode 8. For example, when the red light-emitting element 2R is driven, electrons from the cathode electrode 10R are transported toward the junction region 4I via the n-type doped region 4N of the red ionic layer 4R. When the red light-emitting element 2R is driven, positive holes from the anode electrode 8 are transported toward the junction region 4I via the p-type doped region 4P of the red ionic layer 4R. The injection of carriers from each electrode into the ionic layer 4 and the transport of carriers in the ionic layer 4 are achieved by the same principle as that of the previous embodiment.

Thus, the electrons and the positive holes from each of the electrodes are recombined respectively in the red quantum dots 141, the green quantum dots 14G, and the blue quantum dots 14B present in the light-emitting region 6L or present at a position adjacent to the light-emitting region 6L. In other words, the recombination of the positive holes and the electrons occurs in each quantum dot in the light-emitting region 6L. Accordingly, when the red light-emitting element 2R is driven, from the red ionic layer 4R, white light is obtained from the light-emitting region 6L in which red light from the red quantum dots 14R, green light from the green quantum dots 14G, and blue light from the blue quantum dots 14B are mixed.

Of the white light from the red ionic layer 4R, only a red light component is allowed to pass through the red color filter 26R. Thus, when the red light-emitting element 2R is driven, red light is emitted from the red light-emitting element 2R. By the same principle, when the green light-emitting element 2G is driven, green light is emitted from the green light-emitting element 2G; when the blue light-emitting element 2B is driven, blue light is emitted from the blue light-emitting element 2B. In this way, the display device 1 according to the present embodiment emits red light, green light, and blue light individually from each individual sub light-emitting element.

Figure 16:
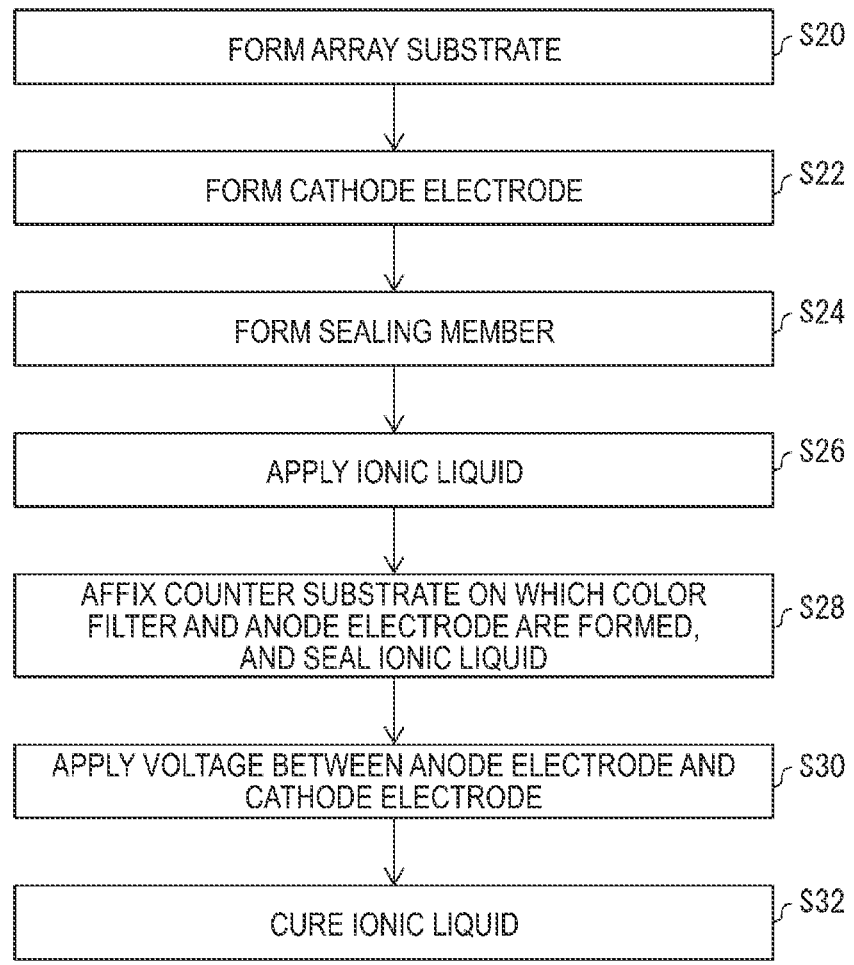
FIG. 16 is a flowchart for describing a manufacturing method for the display device according to the second embodiment, FIG. 17 includes process cross-sectional views for describing the manufacturing method for the display device according to the second embodiment.
Figure 17:
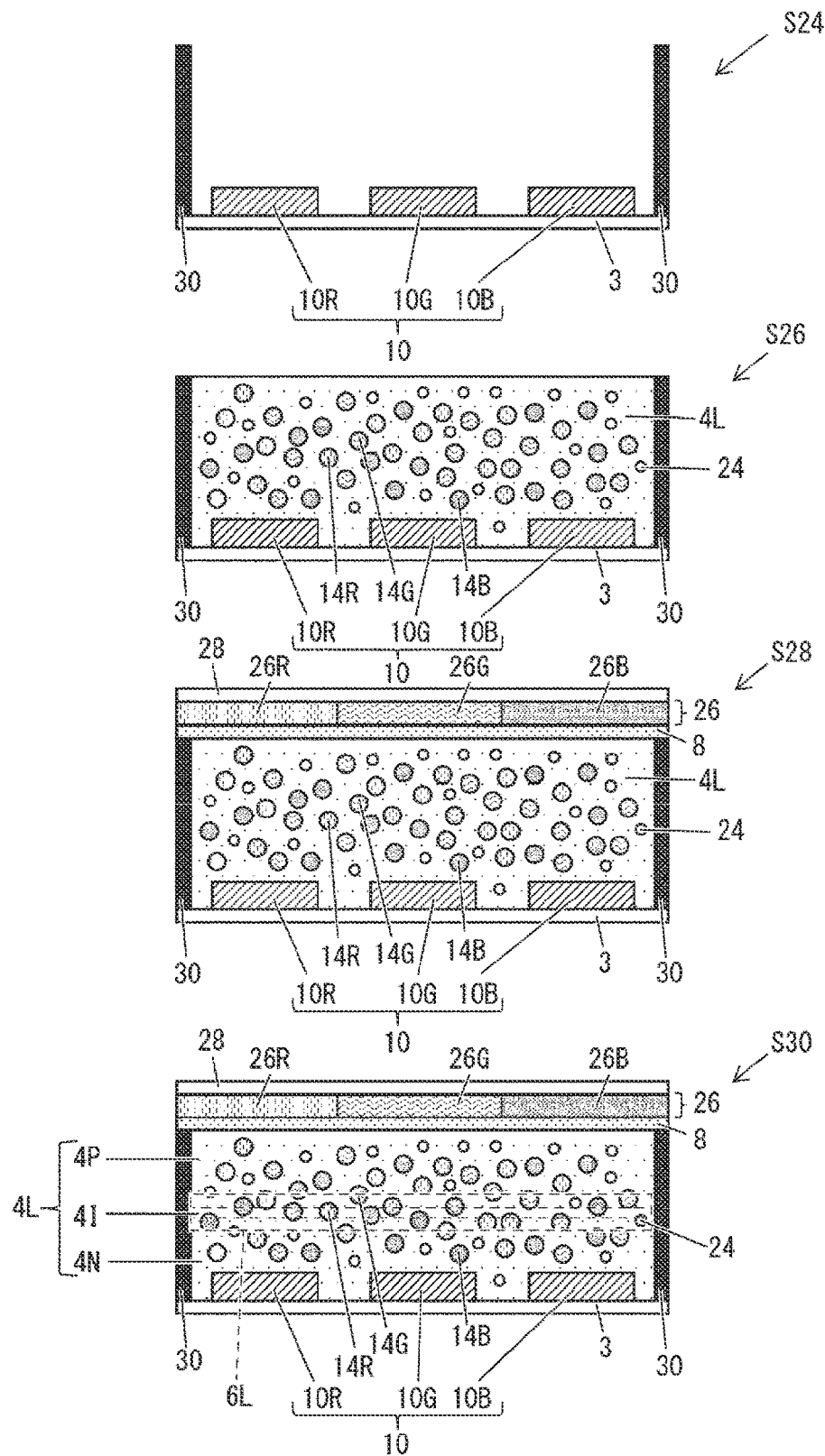

A manufacturing method for the display device 1 according to the present embodiment will be described with reference to a flowchart illustrated in FIG. 16 and process cross-sectional views illustrated in FIG. 17. FIG. 17 illustrates process cross-sectional views of the display device 1 at a position corresponding to FIG. 15.

First, the array substrate 3 is formed (step S20). The formation of the array substrate 3 may be performed by the same technique as that in step S2 in the previous embodiment. Subsequently, the cathode electrode 10 is formed (step S22). Step S22 may be performed by the same technique as step S4 in the previous embodiment.

Next, the sealing member 30 is formed (step S24). As illustrated in step S24 in FIG. 17, the sealing member 30 may be formed in the following manner: a material for the sealing member 30 is applied on the peripheral end portion of the array substrate 3 in a plan view by using a dispenser or the like, for example, and thereafter the material is cured.

Subsequently, an ionic liquid 4L is applied on the upper face of the array substrate 3 and the cathode electrode 10 surrounded by the sealing member 30 (step S26). In the present embodiment, the ionic liquid 4L further contains red quantum dots 14R, green quantum dots 14G, and blue quantum dots 14B in a dispersed state, in comparison to the ionic liquid 4L according to the previous embodiment. The application of the ionic liquid 4I, may be performed by the same technique as that in step S12 in the previous embodiment.

Specifically, the ionic liquid 4L may include a monomer of a precursor of poly [(9,9-dioctyl-2,7-divinylene-fluorenylene)-alt-co-{2-methoxy-5-(2-ethyl-hexyloxy)-1,4-phenylene}] (PF/PPV co-polymer), which is a luminous polymer, as the precursor 24. The ionic liquid 4L may include a quantum dot provided with CdSe/ZnS or InP/ZnSe/ZnS as a core/shell structure. Further, the ionic liquid 4L may include allyltrioctylammonium allylsulfonate (ATOAAS) as a solvent and an ion. In this case, the mass ratio of the precursors 24, the quantum dots, and the solvent and ions in the ionic liquid 4L may be 10:8:3.5.

Next, the sealing of the ionic liquid 4L into the space formed by the array substrate 3, the counter substrate 28, and the sealing member 30 is performed (step S28).

In step S28, first, after the color filter 26 is formed on the counter substrate 28, the anode electrode 8 is further formed on the color filter 26. The anode electrode 8 may be formed by the same technique as the cathode electrode 10.

Subsequently, as illustrated in step S28 in FIG. 17, the counter substrate 28, on which the color filter 26 and the anode electrode 8 are formed, is affixed to the array substrate 3 via the sealing member 30, and then the sealing member 30 is cured by UV irradiation or the like. With this, the sealing step of the ionic liquid 4L is performed.

In other words, step S28 may be performed along a one drop filling (ODF) process, which is a fabrication process generally used in the fabrication of a liquid crystal element, for example.

Subsequent to the sealing step of the ionic liquid 4L, a voltage application step is performed in which the anode electrode 8 and the cathode electrode 10 are driven to apply a voltage to the ionic liquid 4L (step S30). Step S30 may be performed by the same technique as step S14 in the previous embodiment. As illustrated in step S30 in FIG. 17, by the same principle as that described in the previous embodiment, the p-type doped region 4P, the n-type doped region 4N, and the junction region 4I are formed in the ionic 4L in step S30. Along with this, the light-emitting region 6L is formed at a position including the junction region 4I and a location adjacent to the junction region 4I.

Next, while the voltage application of step S30 is continued, at least part of the precursors 24 is cured. Consequently, the ionic layer 4 is formed by curing the ionic liquid 4L (step S32). Step S32 may be performed, for example, by irradiating the precursors 24, which are monomers, with light via the anode electrode 8, which is a transparent electrode, and forming the resin 4S of a polymer. In step S30, when the electrons and the positive holes are recombined in the quantum dots of each light-emitting layer 6 and light emission from each light-emitting layer 6 is obtained, a shift from step S30 to step S32 may be performed. As a result, the display device 1 according to the present embodiment illustrated in FIG. 15 is obtained.

As described in the previous embodiment, the injection of the positive holes from the anode electrode 8 and the injection of the electrons from the cathode electrode 10 to each quantum dot are easily achieved due to the presence of the ions in the ionic layer 4, as compared to a known layered type light-emitting element that does not contain ions. In the present embodiment as well, the ionic layer 4 is a solid layer, and the ions in the ionic layer 4 do not move. Thus, in the light-emitting element 2 according to the present embodiment, similar to the light-emitting element 2 according to the previous embodiment, the effect of improving the response speed is exhibited while improving the luminous efficiency and achieving the reduction in power consumption.

In the present embodiment, the display device 1 does not include the light-emitting layers 6 individually, and the ionic layer 4 has the red quantum dots 14R, green quantum dots 14G, and blue quantum dots 14B common to all of the sub light-emitting elements. Therefore, in the manufacturing step of the display device 1 according to the present embodiment, it is unnecessary to perform separately patterning on the light-emitting layer and the like for each sub light-emitting element. Accordingly, with the configuration described above, the manufacturing step of the display device 1 according to the present embodiment may be simplified.

Third Embodiment

Figure 18:
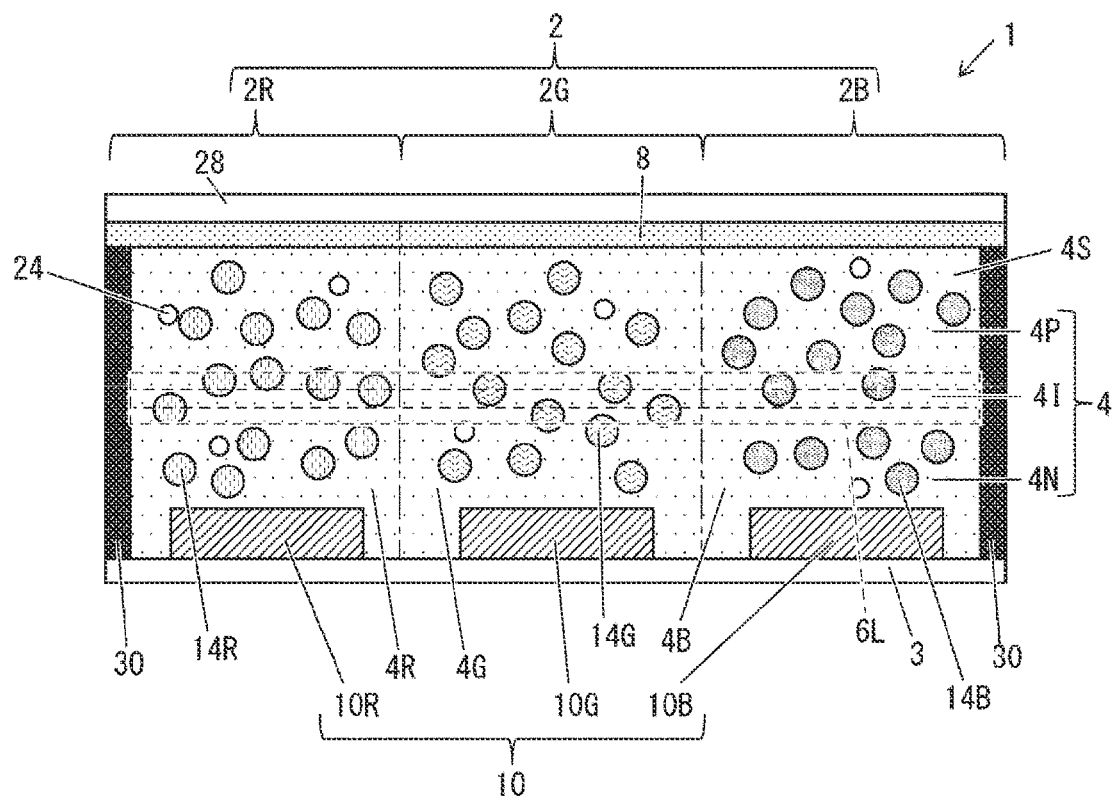
FIG. 18 is a schematic cross-sectional view of a display device according to a third embodiment.

FIG. 18 is a schematic cross-sectional view of a display device 1 according to the present embodiment. In FIG. 18 as well, ions 12 of an ionic layer 4 are not illustrated.

The display device 1 according to the present embodiment does not include the color filter 26 compared to the display device 1 according to the previous embodiment, and further the configuration of the ionic layer 4 differs from that in the previous embodiment. Except for the above point, the display device 1 according to the present embodiment has the same configuration as the display device 1 according to the previous embodiment.

The ionic layer 4 according to the present embodiment includes only quantum dots that emit light of a corresponding color for each sub light-emitting element. To rephrase, a red ionic layer 4R includes only red quantum dots 14R as quantum dots, a green ionic layer 4G includes only green quantum dots 14G as quantum dots, and a blue ionic layer 4B includes only blue quantum dots 14B as quantum dots. Except for the above point, the ionic layer 4 according to the present embodiment has the same configuration as the ionic layer 4 according to the previous embodiment.

Along with this, a red light-emitting element 2R includes only the red quantum dots 14R as quantum dots, and a green light-emitting element 2G includes only the green quantum dots 14G as quantum dots, and a blue light-emitting elements 2B include only the blue quantum dots 14B as quantum dots. Thus, although a light-emitting element 2 is not provided with the color filter 26, only red light is emitted from the red light-emitting element 2R, only green light is emitted from the green light-emitting element 2G, and only blue light is emitted from the blue light-emitting element 2B. In other words, only red light is emitted from a light-emitting region 6L of the red light-emitting element 2R, only green light is emitted from the light-emitting region 6L of the green light-emitting element 2G, and only blue light is emitted from the light-emitting region 6L of the blue light-emitting element 2B.

Figure 19:
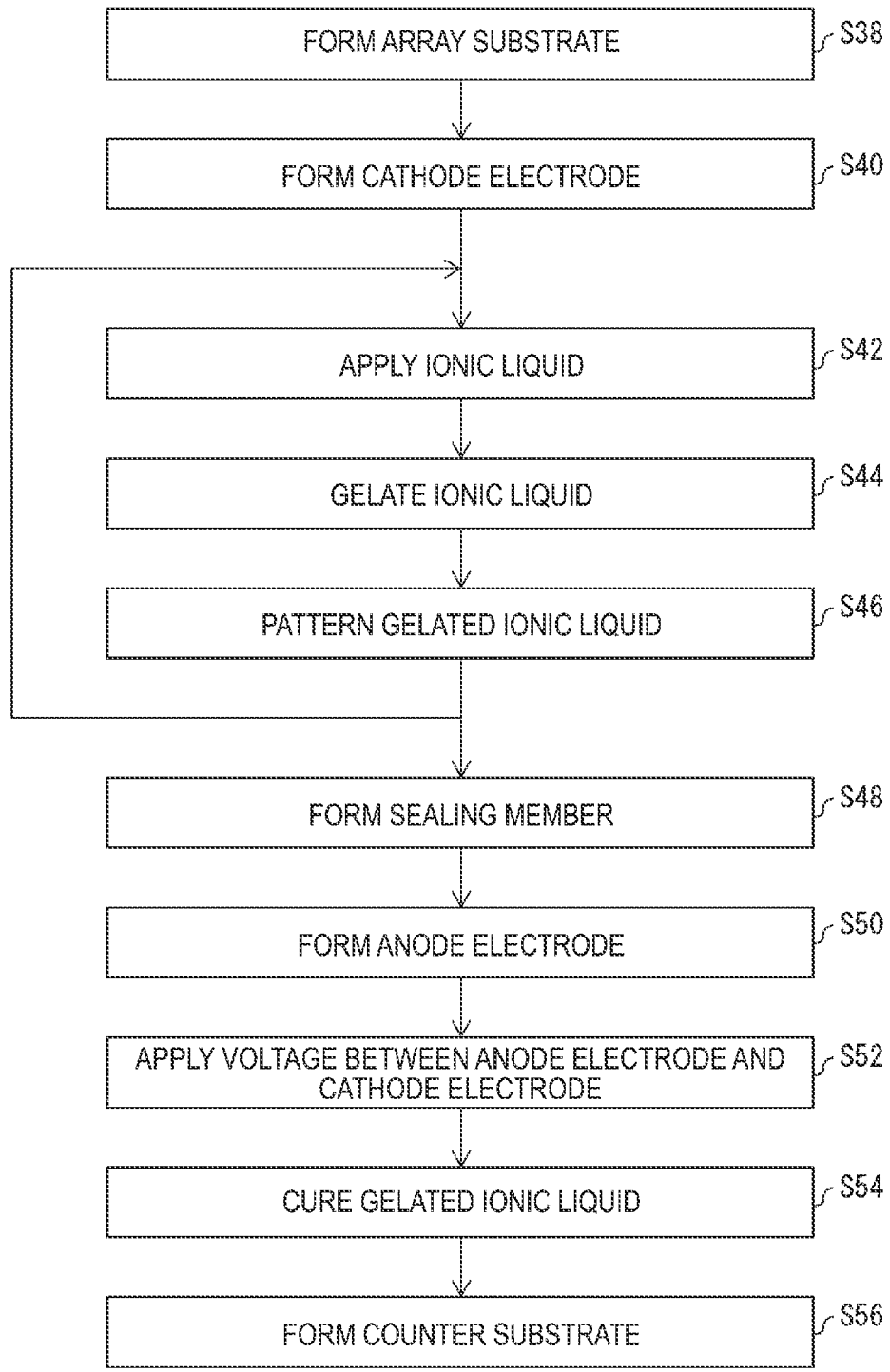
FIG. 19 is a flowchart for describing a manufacturing method for the display device according to the third embodiment.
Figure 20:
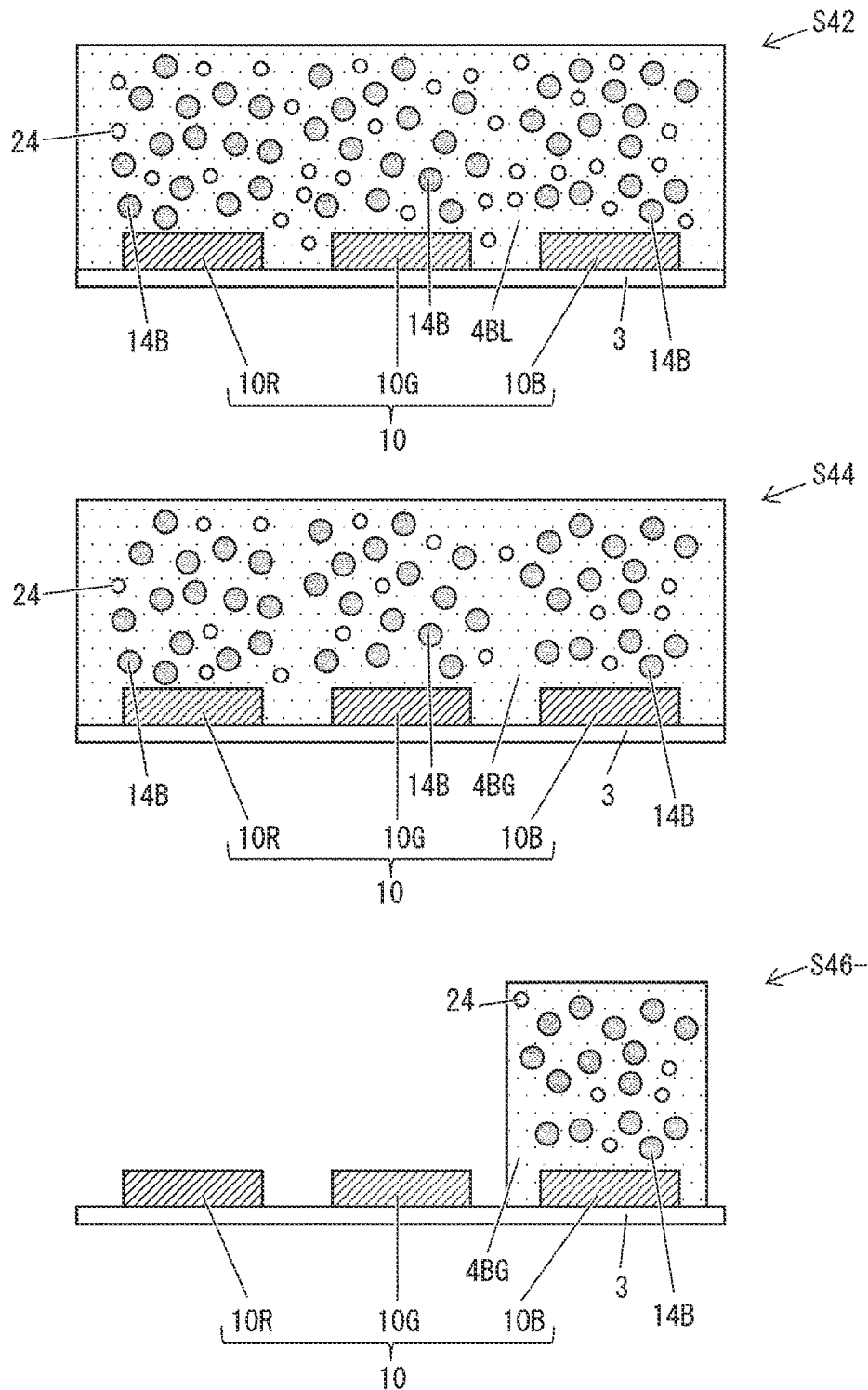
FIG. 20 includes process cross-sectional views for describing the manufacturing method for the display device according to the third embodiment.
Figure 21:
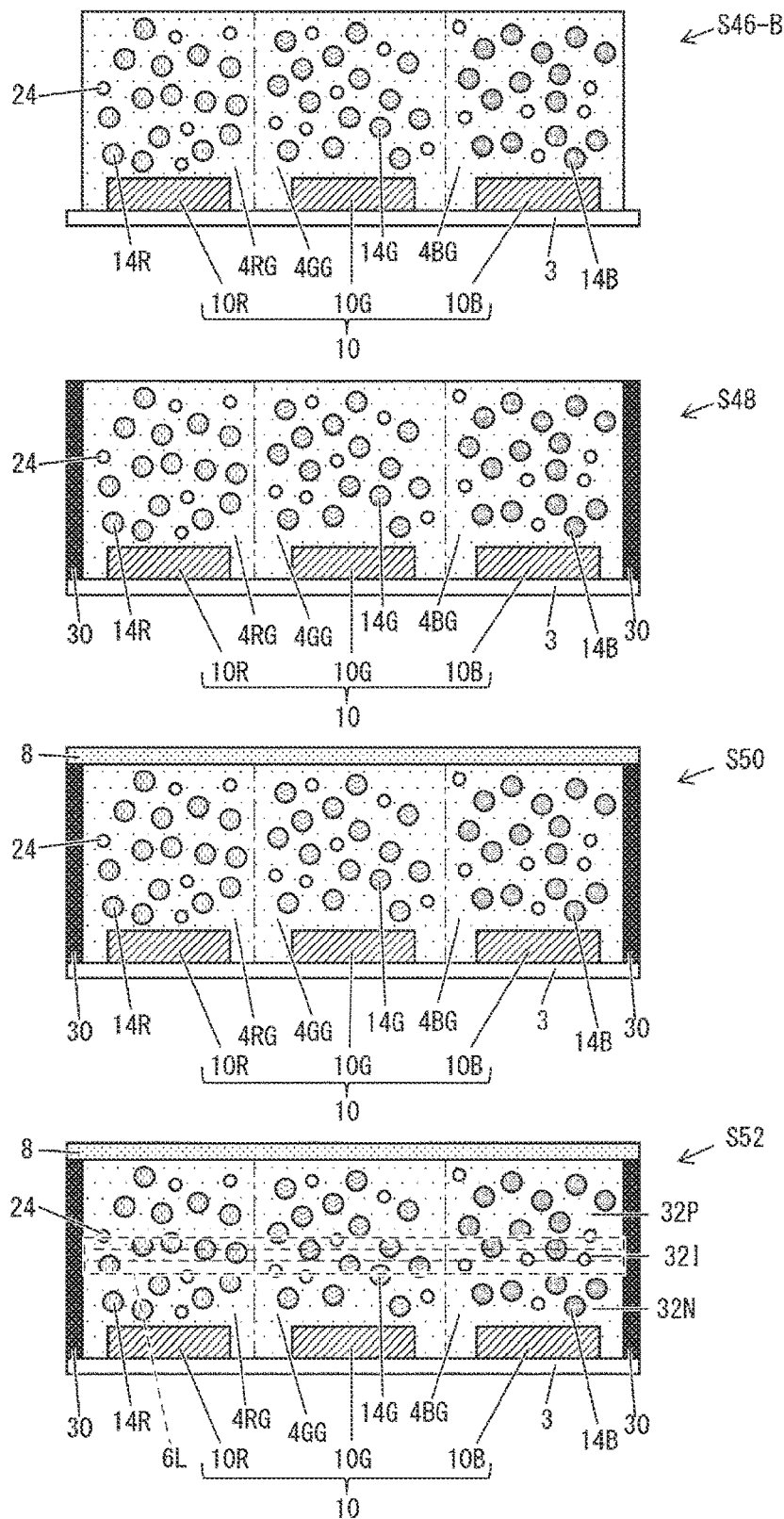
FIG. 21 includes other process cross-sectional views for describing the manufacturing method for the display device according to the third embodiment.

A manufacturing method for the display device 1 according to the present embodiment will be described with reference to a flowchart illustrated in FIG. 19 and process cross-sectional views illustrated in FIG. 20 and FIG. 21. FIGS. 20 and 21 illustrate process cross-sectional views of the display device 1 at a position corresponding to FIG. 18.

First, an array substrate 3 is formed (step S38). Step S38 may be performed by the same technique as step S20 in the previous embodiment. Next, a cathode electrode 10 is formed (step S40). Step S40 may be performed by the same technique as step S22 in the previous embodiment.

Subsequently, an ionic liquid 4L is applied on the upper face of the array substrate 3 and the cathode electrode 10 (step S42). In the present embodiment, the ionic liquid 4L includes, as quantum dots, only the quantum dots corresponding to a certain specific luminescent color in a dispersed state, as compared to the ionic liquid 4L according to the previous embodiment. Specifically, in step S42, a blue ionic liquid 4BL containing, as quantum dots, only blue quantum dots 14B in a dispersed state is applied first, as illustrated in step S42 in FIG. 20, for example.

Next, the applied ionic liquid 4L is gelated (step S44). For example, when the blue ionic liquid 4BL is applied in step S42, in step S44, precursors 24, which are monomers in the blue ionic liquid 4BL, are only partially polymerized so as to obtain a blue ionic gel 4BG, as illustrated in step S44 in FIG. 20.

Subsequently, the gelated ionic liquid is patterned for each sub light-emitting element (step S46). For example, in step S46, by patterning the blue ionic gel 4BG, the blue ionic gel 4BG is formed only at a position where the blue light-emitting element 2B is formed, as illustrated in step S46-A in FIG. 20.

In the present embodiment, the ionic liquid gelated in step S44 has viscosity such that the gelated ionic liquid does not flow out to a position where another adjacent sub light-emitting element is formed when being patterned in step S46. The ionic liquid gelated in step S44 has viscosity such that ions can move in the gelated ionic liquid.

In order to obtain the gelated ionic liquid that satisfies the above-discussed viscosity condition in step S44, the amount of the precursors 24 to be cured may be adjusted in step S44. The amount of the precursors 24 to be cured may be adjusted, for example, by controlling the amount of light emitted to the blue ionic liquid 4BL in step S44.

Next, the type of the quantum dots contained in the ionic liquid 4L is changed, and step S42 to step S46 are performed again. Specifically, the ionic liquid containing, as quantum dots, only the green quantum dots 14G in a dispersed state is subjected to application, gelation, and patterning, thereby obtaining green ionic gel 4GG as illustrated in step S46-B in FIG. 21. Likewise, the ionic liquid containing, as quantum dots, only the red quantum dots 14R in a dispersed state is subjected to application, gelation, and patterning, thereby obtaining red ionic gel 4RG as illustrated in step S46-B in FIG. 21. In this way, the performing of step S42 to step S46 is repeated until the patterning of the gelated ionic liquid corresponding to all of the sub light-emitting elements is completed.

The application of each ionic liquid 4L in step S42 may be performed by the same technique as that in step S26 in the previous embodiment. Each ionic liquid 4L according to the present embodiment may have the same configuration as the ionic liquid 4L according to the previous embodiment except for a point that only the quantum dots corresponding to a certain specific luminescent color are contained in a dispersed state as quantum dots.

Next, a sealing member 30 is formed (step S48). Step S48 may be performed by the same technique as step S24 in the previous embodiment. Next, an anode electrode 8 is formed (step S50). In step S50, the anode electrode 8 may be formed by the same technique as that of the cathode electrode 10. In step S50, as illustrated in step S50 in FIG. 21, the gelated ionic liquid is sealed inside a space formed by the array substrate 3, the anode electrode 8, and the sealing member 30. At this time, the gelated ionic liquid is pressurized and sealed to be in contact with both the array substrate 3 and the anode electrode 8.

Next, a voltage application step is performed in which the anode electrode 8 and the cathode electrode 10 are driven to apply a voltage to the gelated ionic liquid (step S52). Step S52 may be performed by the same technique as step S30 in the previous embodiment. As illustrated in step S52 in FIG. 21, by the same principle as that described in the previous embodiment, a p-type doped region 4P, an n-type doped region 4N, and a junction region 4I are formed in the gelated ionic liquid in step S52. Along with this, the light-emitting region 6L is formed at a position including the junction region 4I and a location adjacent to the junction region 4I.

Subsequently, while the voltage application of step S52 is continued, at least part of the precursors 24 remaining in the gelated ionic liquid is cured. Consequently, the ionic layer 4 is formed by completely curing the gelated ionic liquid (step S54). Step S54 may be performed by the same technique as step S32. In step S52, when the electrons and the positive holes are recombined in the quantum dots of each light-emitting layer 6 and light emission from each light-emitting layer 6 is obtained, a shift from step S52 to step S54 may be performed.

Finally, a counter substrate 28 is formed (step S56), and thus the display device 1 is obtained. The counter substrate 28 may be formed, for example, by affixing a transparent substrate to the anode electrode 8.

In the light-emitting element 2 according to the present embodiment, similar to the light-emitting element 2 according to the previous embodiment, the effect of improving the response speed is exhibited while improving the luminous efficiency and achieving the reduction in power consumption. In the present embodiment, the display device 1 does not include the light-emitting layers 6 individually, and the ionic layer 4 has the red quantum dots 14R, green quantum dots 14G, and blue quantum dots 14B individually for each sub light-emitting element.

Due to this, the display device 1 according to the present embodiment does not require an optical filter such as a color filter. Accordingly, the display device 1 according to the present embodiment may be simplified. In the display device 1 according to the present embodiment, emission light from each sub light-emitting element is not reduced in intensity by an optical filter such as a color filter, and thus the light extraction efficiency may be more enhanced.

The present disclosure is not limited to the embodiments described above, and various modifications may be made within the scope of the claims. Embodiments obtained by appropriately combining technical approaches disclosed in the different embodiments also fall within the technical scope of the present disclosure. Furthermore, novel technical features can be formed by combining the technical approaches disclosed in each of the embodiments.

REFERENCE SIGNS LIST

1 Display device
2 Light-emitting element

4 Ionic layer
4P p-type doped region
4N n-type doped region
4I Junction region
4S Resin
6 Light-emitting layer
6L Light-emitting region
8 Anode electrode
10, 101 Cathode electrode
12 Ion
12N Negative ion
12P Positive ion
14R, 14G, 14B Quantum dot
16 insulating layer
18 Reflective layer
24 Precursor
26 Color filter

The invention claimed is:

1. A light-emitting element, comprising:
an ionic layer being a solid and containing negative ions and positive ions, wherein the negative ions and the positive ions in the ionic layer are immobile;
a light-emitting layer containing quantum dots; and
a cathode electrode and an anode electrode,
wherein the ionic layer includes a p-type doped region on the anode electrode side containing the negative ions in a higher quantity than the positive ions, an n-type doped region on the cathode electrode side containing the positive ions in a higher quantity than the negative ions, and a junction region between the p-type doped region and the n-type doped region, and
the light-emitting layer is adjacent to the junction region.

2. The light-emitting element according to claim 1,
wherein the ionic layer is formed on the light-emitting layer, the cathode electrode, and the anode electrode, and
in a plan view, a region in which the junction region and the light-emitting layer overlap each other is interposed between a region in which the n-type doped region and the light-emitting layer overlap each other and a region in which the p-type doped region and the light-emitting layer overlap each other.

3. The light-emitting element according to claim 1,
wherein the p-type doped region includes the negative ions adjacent to the anode electrode and the light-emitting layer, and the n-type doped region includes the positive ions adjacent to the cathode electrode and the light-emitting layer,
the negative ions increase in quantity toward the anode electrode in the p-type doped region, and
the positive ions increase in quantity toward the cathode electrode in the n-type doped region.

4. The light-emitting element according to claim 1, further comprising a plurality of sub light-emitting elements,
wherein one of the cathode electrode and the anode electrode is an island-shaped electrode formed in an island shape for each of the plurality of sub light-emitting elements, and the other is a common electrode common to the plurality of sub light-emitting elements, and
the common electrode is provided at a position surrounding the island-shaped electrode in a plan view.

5. The light-emitting element according to claim 1, further comprising:
a red light-emitting element;
a green light-emitting element; and
a blue light-emitting element,
wherein the light-emitting layer contains red quantum dots configured to emit red light, green quantum dots configured to emit green light, and blue quantum dots configured to emit blue light, and
the red light-emitting element includes a red color filter, the green light-emitting element includes a green color filter, and the blue light-emitting element includes a blue color filter.

6. The light-emitting element according to claim 1, further comprising:
a red light-emitting element;
a green light-emitting element; and
a blue light-emitting element,
wherein the light-emitting layer contains a red light-emitting layer including red quantum dots configured to emit red light, a green light-emitting layer including green quantum dots configured to emit green light, and a blue light-emitting layer including blue quantum dots configured to emit blue light, and
the red light-emitting element includes the red light-emitting layer, the green light-emitting element includes the green light-emitting layer, and the blue light-emitting element includes the blue light-emitting layer.

7. The light-emitting element according to claim 1, further comprising a reflective layer configured to reflect light,
wherein the junction region, the light-emitting layer, and the reflective layer are provided overlapping one another in this order in a plan view.

8. The light-emitting element according to claim 1,
wherein at least one of the cathode electrode and the anode electrode overlaps with the junction region in a plan view, and is formed as a reflective electrode.

9. The light-emitting element according to claim 1,
wherein an outer shape of at least one of the cathode electrode and the anode electrode includes a projection and a recess in a plan view.

10. A light-emitting element, comprising:
a cathode electrode and an anode electrode; and
an ionic layer being a solid and positioned between the cathode electrode and the anode electrode, and containing negative ions, positive ions, and quantum dots,
wherein the negative ions and the positive ions in the ionic layer are immobile;
wherein the ionic layer includes a p-type doped region on the anode electrode side containing the negative ions in a higher quantity than the positive ions, an n-type doped region on the cathode electrode side containing the positive ions in a higher quantity than the negative ions, and a junction region between the p-type doped region and the n-type doped region,
the ionic layer contains the quantum dots in the junction region or contains the quantum dots adjacent to the junction region,
the quantum dots contain red quantum dots configured to emit red light, green quantum dots configured to emit green light, and blue quantum dots configured to emit blue light, and
the red quantum dots, the green quantum dots, and the blue quantum dots are present being mixed in the ionic layer.

11. The light-emitting element according to claim 10,
wherein the p-type doped region includes the negative ions at a position adjacent to the anode electrode, and the n-type doped region includes the positive ions at a position adjacent to the cathode electrode, the negative ions increase in quantity toward the anode electrode in the p-type doped region, and the positive ions increase in quantity toward the cathode electrode in the n-type doped region.

12. The light-emitting element according to claim 10, wherein one of the cathode electrode and the anode electrode is a transparent electrode, and the other is a reflective electrode.

13. The light-emitting element according to claim 10, further comprising:

a red light-emitting element;

a green light-emitting element; and a blue light-emitting element, wherein the the ionic layer contains a red ionic layer including the red quantum dots configured to emit red light, a green ionic layer including the green quantum dots configured to emit green light, and a blue ionic layer including the blue quantum dots configured to emit blue light, and the red light-emitting element includes the red ionic layer, the green light-emitting element includes the green ionic layer, and the blue light-emitting element includes the blue ionic layer.

14. The light-emitting element according to claim 1, wherein the ionic layer contains a curable resin.

15. A light-emitting device, comprising:

at least one of the light-emitting element according to claim 1.

16. A method for manufacturing a light-emitting element, the method comprising:

forming a cathode electrode and an anode electrode;

forming a light-emitting layer containing quantum dots;

subsequent to the forming a light-emitting layer, applying an ionic liquid containing negative ions, positive ions, and a curable resin to a position in contact with the light-emitting layer;

applying a voltage to the ionic liquid by driving the cathode electrode and the anode electrode, after the applying an ionic liquid, the forming a light-emitting layer, and the forming a cathode electrode and an anode electrode; and forming a solid ionic layer by curing the ionic liquid while the applying a voltage to the ionic liquid is being carried out wherein the negative ions and the positive ions in the solid ionic layer are immobile.

* * * * *